(12) United States Patent
Okayasu et al.

(10) Patent No.: US 7,774,081 B2
(45) Date of Patent: Aug. 10, 2010

(54) MANUFACTURING SYSTEM, MANUFACTURING METHOD, MANAGING APPARATUS, MANAGING METHOD AND COMPUTER READABLE MEDIUM

(75) Inventors: Toshiyuki Okayasu, Tokyo (JP); Shigetoshi Sugawa, Miyagi (JP); Akinobu Teramoto, Miyagi (JP)

(73) Assignee: Advantest Corporation, Tokyo (JP)

( * ) Notice: Subject to any disclaimer, the term of this patent is extended or adjusted under 35 U.S.C. 154(b) by 253 days.

(21) Appl. No.: 12/046,457

(22) Filed: Mar. 12, 2008

(65) Prior Publication Data
US 2009/0058456 A1 Mar. 5, 2009

Related U.S. Application Data

(63) Continuation of application No. PCT/JP2005/016856, filed on Sep. 13, 2005.

(51) Int. Cl.
G06F 19/00 (2006.01)
G01N 37/00 (2006.01)
G11C 16/04 (2006.01)
H01R 31/26 (2006.01)
H01L 21/66 (2006.01)

(52) U.S. Cl. ............... 700/108; 700/109; 700/110; 702/84; 702/185; 365/185.21; 365/185.24; 438/14

(58) Field of Classification Search ......... 700/108–110; 702/84, 182–186; 340/3.43–3.44, 3.71; 438/14, 438/689, 780; 365/185.21, 185.24, 237.2
See application file for complete search history.

(56) References Cited

U.S. PATENT DOCUMENTS

| | | | | |
|---|---|---|---|---|
| 5,650,961 A | * | 7/1997 | Himeno et al. | 365/185.17 |
| 5,761,125 A | * | 6/1998 | Himeno | 365/185.24 |
| 6,157,444 A | * | 12/2000 | Tomita et al. | 356/237.1 |
| 6,384,909 B2 | * | 5/2002 | Tomita et al. | 356/237.1 |
| 6,683,683 B2 | * | 1/2004 | Tomita et al. | 356/237.2 |
| 6,716,648 B2 | * | 4/2004 | Iriki | 438/14 |
| 7,042,564 B2 | * | 5/2006 | Shoham et al. | 356/237.2 |
| 2004/0028267 A1 | * | 2/2004 | Shoham et al. | 382/141 |
| 2007/0024311 A1 | * | 2/2007 | Ohashi et al. | 324/765 |
| 2007/0054199 A1 | * | 3/2007 | Wakabayashi | 430/5 |

FOREIGN PATENT DOCUMENTS

| | | |
|---|---|---|
| JP | 08-195406 | 7/1996 |
| JP | 2002-175982 | 6/2002 |
| JP | 2005-197458 | 7/2005 |

* cited by examiner

Primary Examiner—Ramesh B Patel
(74) Attorney, Agent, or Firm—Jianq Chyun IP Office

(57) ABSTRACT

There is provided a manufacturing system for manufacturing an electronic device through a plurality of manufacturing stages. The manufacturing system includes a plurality of manufacturing apparatuses performing processes corresponding to the plurality of manufacturing stages. The manufacturing system includes a manufacturing line that manufactures the electronic device, a manufacturing control section that causes the manufacturing line to manufacture a wafer having therein a test circuit including a plurality of transistors under measurement, a measuring section that measures an electrical characteristic of each of the plurality of transistors under measurement in the test circuit, an identifying section that identifies, among the plurality of manufacturing stages, a manufacturing stage in which a defect is generated, with reference to a distribution, on the wafer, of one or more transistors under measurement whose electrical characteristics do not meet a predetermined standard, and a setting changing section that changes a setting for a manufacturing apparatus that performs a process corresponding to the manufacturing stage in which the defect is generated.

38 Claims, 17 Drawing Sheets

1

MANUFACTURING SYSTEM, MANUFACTURING METHOD, MANAGING APPARATUS, MANAGING METHOD AND COMPUTER READABLE MEDIUM

CROSS REFERENCE TO RELATED APPLICATION

This is a continuation application of PCT/JP2005/16856 filed on Sep. 13, 2005.

BACKGROUND

1. Technical Field

The present invention relates to a manufacturing system, a manufacturing method, a management apparatus, a management method, and a computer readable medium. More particularly, the present invention relates to a manufacturing system, a manufacturing method, a management apparatus, a management method, and a computer readable medium used for manufacturing electronic devices with appropriate management of the manufacturing line.

2. Related Art

In recent years, the physical sizes of semiconductor elements have been significantly reduced. The size reduction of the semiconductor elements accordingly reduces the defect size which affects the characteristics of the semiconductor elements. Such size reduction in the semiconductor elements and defects increases the unevenness of the characteristics of the semiconductor elements. This poses a problem for the circuit manufacturing process. For example, the unevenness of the characteristics (such as the threshold voltages and current-voltage characteristics) of MOS transistors considerably influences the reliability of the entire circuits and the yield of the circuit manufacturing process.

In addition to the statistically detected unevenness mentioned above, local defects such as bit defects and spot defects are found in a few units out of 10,000 to 1,000,000 units. Such local defects also determine the reliability and yield of the circuits, and thus pose a problem for the circuit manufacturing process.

Referring to the electronic device manufacturing process, it has been attempted to reduce the above-stated characteristics unevenness and local defects of the elements so as to realize high reliability and yield. To achieve this goal, it is desired to promptly identify one or more manufacturing stages, among a plurality of manufacturing stages designed for manufacturing the electronic devices, in which problems are occurring and to appropriately change the processing conditions related to the manufacturing apparatuses performing the processes corresponding to the identified manufacturing stages with the problems.

Exemplary conventional methods to judge the acceptability of each manufacturing stage are described in the following. A test wafer or the like is thrown into the manufacturing line. Then, the thickness of the insulation film formed on the wafer is measured with the use of a scanning electron microscope (SEM). Alternatively, whether particle or metal contamination is present is examined in an optical manner or by using the X-ray. For example, Patent Document 1 discloses a technique to correct the operating conditions of an exposure apparatus with reference to processed state information obtained by measuring, for example, the shape of the pattern on a pilot wafer which is exposed to light using the exposure apparatus (please see the paragraphs [0034] to [0039] of Patent Document 1 and the like)

Referring to the manufacturing line of the electronic devices, which are manufactured under the policy of mass-production with a small number of varieties, such as memory devices, the quality of the manufacturing line is managed by monitoring the yield of the final products.

Patent Document 1: Japanese Patent No. 3371899

When the acceptability of the manufacturing line is judged by observing the pattern formed on the wafer, time limitations make it impossible to observe a large number of patterns. Therefore, it is difficult to determine the characteristics unevenness and local defects of the elements. Hence, it is possible to directly reflect the result of the observation, for example, to feed back the observed shape of the pattern to the exposure apparatus, but it has been difficult to obtain sufficient data for appropriately identify the problematic manufacturing stages or for finely adjusting the parameters set for the manufacturing apparatuses.

When the yield of the final products is monitored, a long time period is required to realize the feedback. In addition, it is difficult to sufficiently obtain the characteristics of the electronic devices which are completed as products. Therefore, it has been difficult to appropriately identify the problematic manufacturing stages and adjust the parameters set for the manufacturing apparatuses.

SUMMARY

Therefore, it is an object of an aspect of the innovations herein to provide a manufacturing system, a manufacturing method, a management apparatus, a management method and a program which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary management method may include a management method of managing a quality of a manufacturing line that is designed for manufacturing an electronic device through a plurality of manufacturing stages. The management method includes a manufacturing step of manufacturing, through the manufacturing line, a wafer that has therein a test circuit including a plurality of transistors under measurement, a measuring step of measuring an electrical characteristic of each of the plurality of transistors under measurement, and an identifying step of identifying, among the plurality of manufacturing stages, a manufacturing stage in which a defect is generated, with reference to a distribution, on the wafer, of one or more transistors under measurement whose electrical characteristics do not meet a predetermined standard.

According to the second aspect related to the innovations herein, one exemplary manufacturing method may include a manufacturing method of manufacturing the electronic device through the manufacturing line whose quality is managed by the above-described management method.

According to the third aspect related to the innovations herein, one exemplary management apparatus may include a management apparatus for managing a quality of a manufacturing line that is designed for manufacturing an electronic device through a plurality of manufacturing stages. The management apparatus includes a manufacturing control section that causes the manufacturing line to manufacture a wafer that has therein a test circuit including a plurality of transistors under measurement, a measuring section that measures an electrical characteristic of each of the plurality of transistors under measurement, and an identifying section that identifies, among the plurality of manufacturing stages, a manufacturing stage in which a defect is generated, with reference to a distribution, on the wafer, of one or more transistors under measurement whose electrical characteristics do not meet a predetermined standard.

According to the fourth aspect related to the innovations herein, one exemplary manufacturing method may include a manufacturing method of manufacturing an electronic device through a manufacturing line that has a plurality of manufacturing apparatuses performing processes corresponding to a plurality of manufacturing stages. The manufacturing method includes a manufacturing step of manufacturing, through the manufacturing line, a wafer that has therein a test circuit including a plurality of transistors under measurement, a measuring step of measuring an electrical characteristic of each of the plurality of transistors under measurement included in the test circuit, an identifying step of identifying, among the plurality of manufacturing stages, a manufacturing stage in which a defect is generated, with reference to a distribution, on the wafer, of one or more transistors under measurement whose electrical characteristics do not meet a predetermined standard, and a condition changing step of changing a processing condition related to a manufacturing apparatus performing a process corresponding to the manufacturing stage in which the defect is generated. Here, the manufacturing step includes, when a processing condition related to at least one of the plurality of manufacturing apparatuses is changed, manufacturing the electronic device through the manufacturing line with the changed processing condition.

According to the fifth aspect related to the innovations herein, one exemplary manufacturing method may include a manufacturing method of manufacturing an electronic device. The manufacturing method includes a manufacturing step of manufacturing a wafer having therein a plurality of test circuits and a plurality of electronic devices, each of the plurality of test circuits including a plurality of transistors under measurement, a measuring step of measuring an electrical characteristic of each of the plurality of transistors under measurement in each of the plurality of test circuits, an identifying step of identifying, among the plurality of electronic devices, a defective device which is likely to experience a defect, with reference to a distribution, on the wafer, of one or more transistors under measurement whose electrical characteristics do not meet a predetermined standard, a selecting step of selecting, from the plurality of electronic devices, one or more electronic devices other than the defective device, and a product output step of outputting, as one or more products, the one or more electronic devices selected in the selecting step.

According to the sixth aspect related to the innovations herein, one exemplary manufacturing system may include a manufacturing system for manufacturing an electronic device through a plurality of manufacturing stages. The manufacturing system includes a plurality of manufacturing apparatuses performing processes corresponding to the plurality of manufacturing stages. The manufacturing system includes a manufacturing line that manufactures the electronic device, a manufacturing control section that causes the manufacturing line to manufacture a wafer that has therein a test circuit including a plurality of transistors under measurement, a measuring section that measures an electrical characteristic of each of the plurality of transistors under measurement included in the test circuit, an identifying section that identifies, among the plurality of manufacturing stages, a manufacturing stage in which a defect is generated, with reference to a distribution, on the wafer, of one or more transistors under measurement whose electrical characteristics do not meet a predetermined standard, and a setting changing section that changes a setting for a manufacturing apparatus performing a process corresponding to the manufacturing stage in which the defect is generated.

According to the seventh aspect related to the innovations herein, one exemplary manufacturing system may include a manufacturing system for manufacturing an electronic device. The manufacturing system includes a manufacturing line that manufactures a wafer having therein a plurality of test circuits and a plurality of electronic devices, where each of the plurality of test circuits includes a plurality of transistors under measurement, a measuring section that measures an electrical characteristic of each of the plurality of transistors under measurement in each of the plurality of test circuits, an identifying section that identifies, among the plurality of electronic devices, a defective device which is likely to experience a defect, with reference to a distribution, on the wafer, of one or more transistors under measurement whose electrical characteristics do not meet a predetermined standard, a selecting section that selects, from the plurality of electronic devices, one or more electronic devices other than the defective device, and a product output section that outputs, as one or more products, the one or more electronic devices selected by the selecting section.

According to the eighth aspect related to the innovations herein, one exemplary computer readable medium may include a computer readable medium storing thereon a program for use with a management apparatus that manages a quality of a manufacturing line designed for manufacturing an electronic device through a plurality of manufacturing stages. When executed, the program causes the management apparatus to function as a manufacturing control section that causes the manufacturing line to manufacture a wafer that has therein a test circuit including a plurality of transistors under measurement, and an identifying section that receives a measured electrical characteristic of each of the plurality of transistors under measurement, and identifies, among the plurality of manufacturing stages, a manufacturing stage in which a defect is generated, with reference to a distribution, on the wafer, of one or more transistors under measurement whose electrical characteristics do not meet a predetermined standard.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

Figure 1:
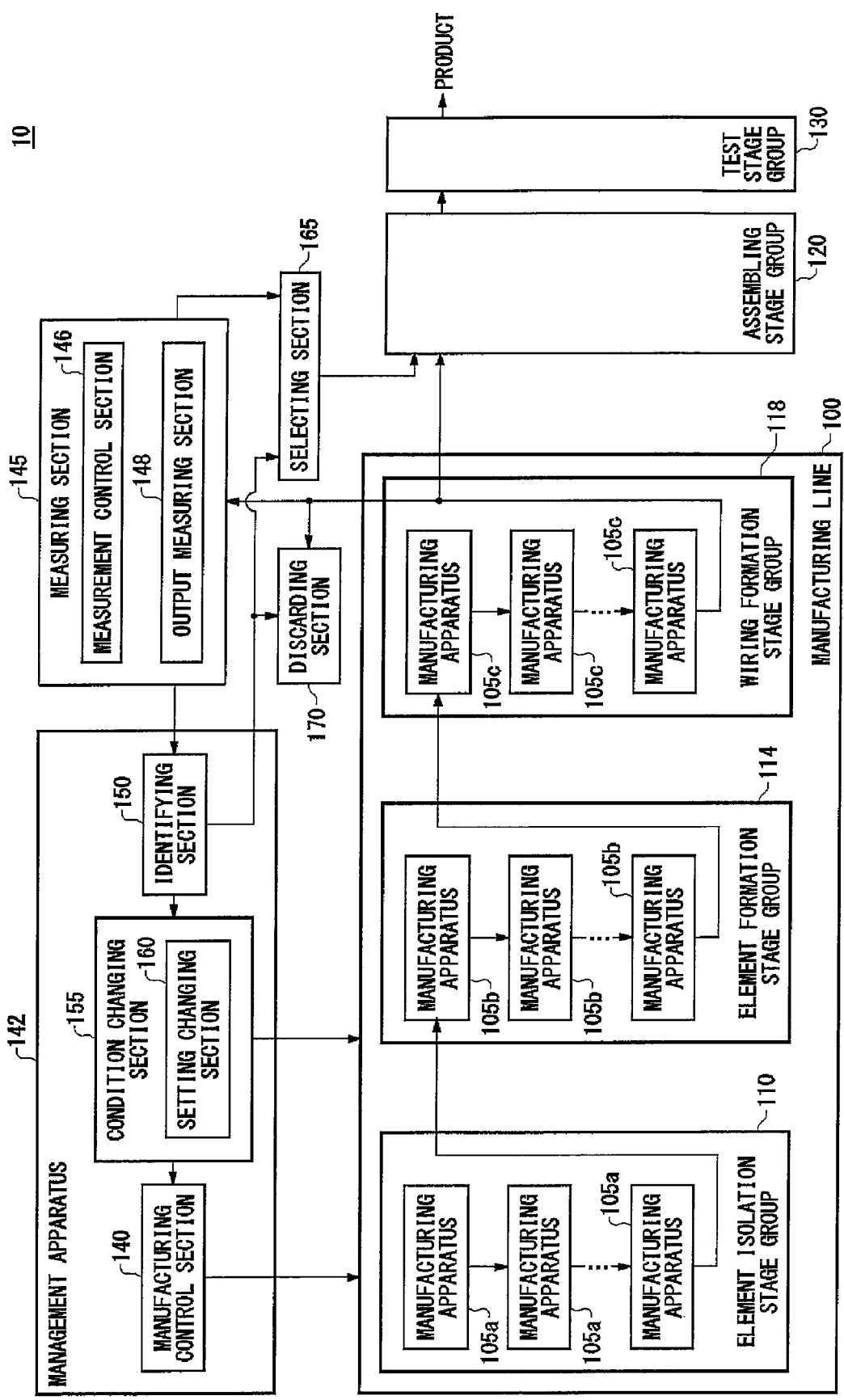
FIG. 1 illustrates the configuration of a manufacturing system 10 relating to an embodiment of the present invention.

FIG. 1 illustrates the configuration of a manufacturing system 10 relating to an embodiment of the present invention. The manufacturing system 10 forms test circuits (test element groups or TEGs) on a test wafer or product wafer, so as to use the test circuits for managing the quality of each manufacturing apparatus 105 or the product yield. Through such management, the manufacturing system 10 manufactures reliable electronic devices with a high yield. The manufacturing system 10 includes therein a manufacturing line 100, an assembling stage group 120, a test stage group 130, a management apparatus 142, a measuring section 145, a selecting section 165, and a discarding section 170. The management apparatus 142 has a manufacturing control section 140, an identifying section 150, and a condition changing section 155.

The manufacturing line 100 manufactures electronic devices through a plurality of manufacturing stages. According to the present embodiment, the manufacturing line 100 manufactures a wafer having therein electronic devices which are to be treated as products. Additionally, to manage the quality of each manufacturing stage, the manufacturing line 100 manufactures a wafer having therein test circuits each of which includes a plurality of transistors under measurement. The manufacturing line 100 may manufacture a wafer having therein both electronic devices and test circuits.

The manufacturing line 100 includes a plurality of manufacturing apparatuses 105 which perform processes corresponding to the plurality of manufacturing stages. The manufacturing stages of the manufacturing line 100 are grouped into an element isolation stage group 110, an element formation stage group 114, and a wiring formation stage group 118. The element isolation stage group 110 (an isolation stage group) electrically isolates, from each other, the regions on a substrate (the wafer) in which the individual elements (such as transistors) are disposed, by using one or more manufacturing apparatuses 105a. The element formation stage group 114 forms the individual elements on the wafer by using one or more manufacturing apparatuses 105b. The element isolation stage group 110 and the element formation stage group 114 may be collectively referred to as a substrate stage of forming elements such as transistors on the substrate, or as the front end of the line (FEOL). The wiring formation stage group 118 forms wirings that provide connections, for example, between the elements formed on the wafer or between the elements and the terminals, by using one or more manufacturing apparatuses 105c. The wiring formation stage group 118 is also referred to as a wiring stage of forming wirings on the substrate on which the elements have been formed, or as the back end of the line (BEOL).

In the manufacturing line 100, each of the element isolation stage group 110, the element formation stage group 114 and the wiring formation stage group 118 uses, for example, one or more of the following stages to manufacture a target semi-finished product. One or more manufacturing apparatuses 105 (105a to 105c) respectively perform corresponding one or more of the following stages. Alternatively, a single manufacturing apparatus 105 (105a to 105c) may be used to perform more than one of the following stages.

(1) Cleaning Stage

The cleaning stage is performed to clean the surface of the substrate by removing, for example, particle or metal contamination on the surface of the substrate.

In the cleaning stage, the wet or dry cleaning technique is used, for example.

(2) Thermal Process Stage

The thermal process stage is performed to heat the wafer. The thermal process includes the thermal oxidization process for forming a thermally oxidized film and the annealing process for, for example, ion activation after ion implantation.

(3) Impurity Introducing Stage

The impurity introducing stage is performed to introduce impurities onto the substrate. For example, the impurities such as boron (B) and phosphor (P) are introduced by using the ion implantation or other techniques onto a semiconductor substrate such as a silicon substrate, to form a P-N junction, for example.

(4) Film Formation Stage (Thin Film Formation Stage)

The film formation stage is performed to deposit, on the substrate, a thin film such as an Si oxide film, an Si nitride film, a polysilicon film and a Cu film, by using any of the techniques including the Chemical Vapor Deposition (CVD) method, the Physical Vapor Deposition (PVD) method, the application/coating method, and the electroplating method.

(5) Lithography Stage

In the lithography stage, a photoresist is applied onto the substrate, a pattern of the photoresist is exposed to light with the use of a mask, and the photoresist is developed.

(6) Etching Stage

The etching stage removes a portion of the film formed under the photoresist, which becomes externally exposed since the photoresist is partially removed as a result of the development, by using the etching technique. After this, the photoresist is removed. The etching technique used includes plasma etching, reactive ion etching (RIE), and wet etching with the use of a chemical solution.

(7) Flattening Stage

In the flattening stage, the surface of the substrate is polished so as to become flat. The flattening stage uses the chemical and mechanical polishing (CMP) method, for example.

For example, Dynamic RAM (DRAM) is manufactured through 500 to 600 stages, and CMOS-LSI is manufactured through 300 to 400 stages.

The assembling stage group 120 cuts the individual electronic devices out of the wafer manufactured by the manufacturing line 100, and packages the individual electronic devices. The assembling stage group 120 may include, for example, a scribing stage of cutting the individual electronic devices out of the wafer, a die bonding stage of attaching each electronic device onto a package, a wire bonding stage of connecting together the wirings of the chip and package, and a sealing stage of enclosing a gas into the package. The assembling stage group 120 is implemented by a plurality of assembling apparatuses.

The test stage group 130 performs tests including a current test and a logic test on each electronic device that has been packaged as a product, and eliminates defective electronic devices. The test stage group 130 is implemented by one or more test apparatuses.

The management apparatus 142 manages the manufacturing line 100. The management apparatus 142 may be realized in such a manner that a program for managing the manufacturing line 100 is executed on a computer.

The manufacturing control section 140 manages the manufacturing line 100, and controls the wafer manufacture by the manufacturing line 100. The measuring section 145 measures the electrical characteristics of a plurality of transistors under measurement included in each test circuit formed on the wafer. The measuring section 145 may be a semiconductor test apparatus, for example. The measuring section 145 includes a measurement control section 146 and an output measuring section 148. The measurement control section 146 sequentially selects each circuit under measurement including a transistor under measurement formed on the test circuit. The output measuring section 148 measures the electrical characteristic of the selected transistor under measurement based on the output signal output from the selected circuit under measurement.

The identifying section 150 receives, from the measuring section 145, the measured electrical characteristics of the transistors under measurement and identifies, among the manufacturing stages, one or more manufacturing stages in which defects are generated, with reference to the distribution, on the wafer, of transistors under measurement whose electrical characteristics do not meet a predetermined standard. The identifying section 150 may perform this identifying procedure on either a test wafer in which electronic devices to be treated as products are not disposed or a product wafer in which electronic devices to be treated as products and test circuits are both disposed.

When the manufacturing line 100 manufactures a wafer having thereon a plurality of test circuits and a plurality of electronic devices, the identifying section 150 identifies, among the electronic devices, one or more defective devices in which defects may be generated, with reference to the distribution, on the wafer, of the transistors under measurement whose electrical characteristics do not meet the predetermined standard.

When the identifying section 150 identifies the manufacturing stages in which defects are generated, the condition changing section 155 changes the processing conditions of the manufacturing apparatuses 105 performing the processes corresponding to the identified manufacturing stages in which defects are generated. In the present embodiment, "line management" indicates a procedure of identifying the manufacturing stages in which defects are generated with reference to the electrical characteristics of the transistors under measurement included in the test circuit and changing the processing conditions through the feedback. When the defects are eliminated by changing the settings of the manufacturing apparatuses 105 (e.g. the parameters set for the manufacturing apparatuses 105), a setting changing section 160 within the condition changing section 155 changes the settings of the manufacturing apparatuses 105 performing the processes corresponding to the identified manufacturing stages in which the defects are generated. For example, the setting changing section 160 changes the parameters including the processing time period, the processing temperature, the voltage to be applied, and the pressure within the chamber. On the other hand, when it is necessary to change processing conditions which are not the settings of the manufacturing apparatuses 105, the condition changing section 155 may change the materials used, clean the chamber and the like, and repair/replace any manufacturing apparatuses 105, as required.

When defective devices are identified among the plurality of electronic devices formed on the wafer, the selecting section 165 selects electronic devices which are not the defective devices. In the present embodiment, "yield management" indicates a procedure of eliminating the defective devices with reference to the electrical characteristics of the transistors under measurement formed in the test circuit.

Figure 2:
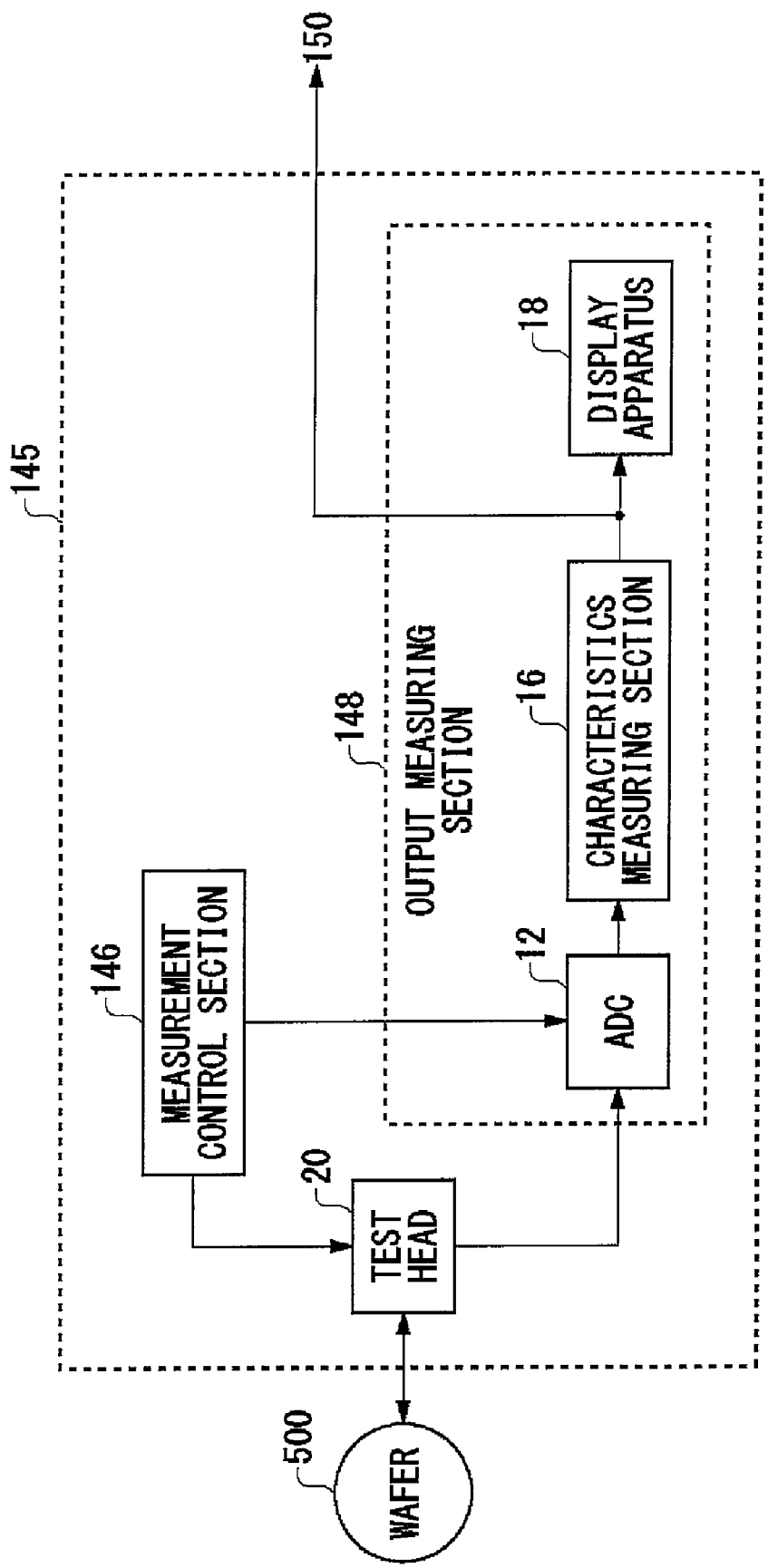
FIG. 2 illustrates the configuration of a measuring section 145 relating to the embodiment of the present invention.

FIG. 2 illustrates the configuration of the measuring section 145 relating to the present embodiment. The measuring section 145 is an apparatus designed to measure the electrical characteristics of a wafer 500 in which one or more test circuits are formed. The measuring section 145 includes therein a test head 20, the measurement control section 146, and the output measuring section 148 containing therein an ADC 12, a characteristics measuring section 16, and a display apparatus 18.

The test head 10 is electrically connected to the test circuits formed in the wafer 500, so as to transmit/receive signals to/from the test circuits. The measurement control section 146 controls the test circuits in the wafer 500 through the test head 10. The ADC 12 converts the signals output from the test circuits in the wafer 500 through the test head 10, into digital data.

The characteristics measuring section 16 measures the electrical characteristics of the test circuits in the wafer 500, based on the digital data output from the ADC 12. For example, the characteristics measuring section 16 measures the threshold voltages, current-voltage characteristics, leakage currents and other characteristics of the transistors under measurement included in each test circuit.

The display apparatus 18 displays thereon the electrical characteristics of the transistors under measurement. For example, the display apparatus 18 displays characteristics information indicating the voltage value of the threshold voltage of each transistor under measurement, at the coordinates corresponding to the transistor under measurement within the display plane of the display apparatus 18.

Figure 3:
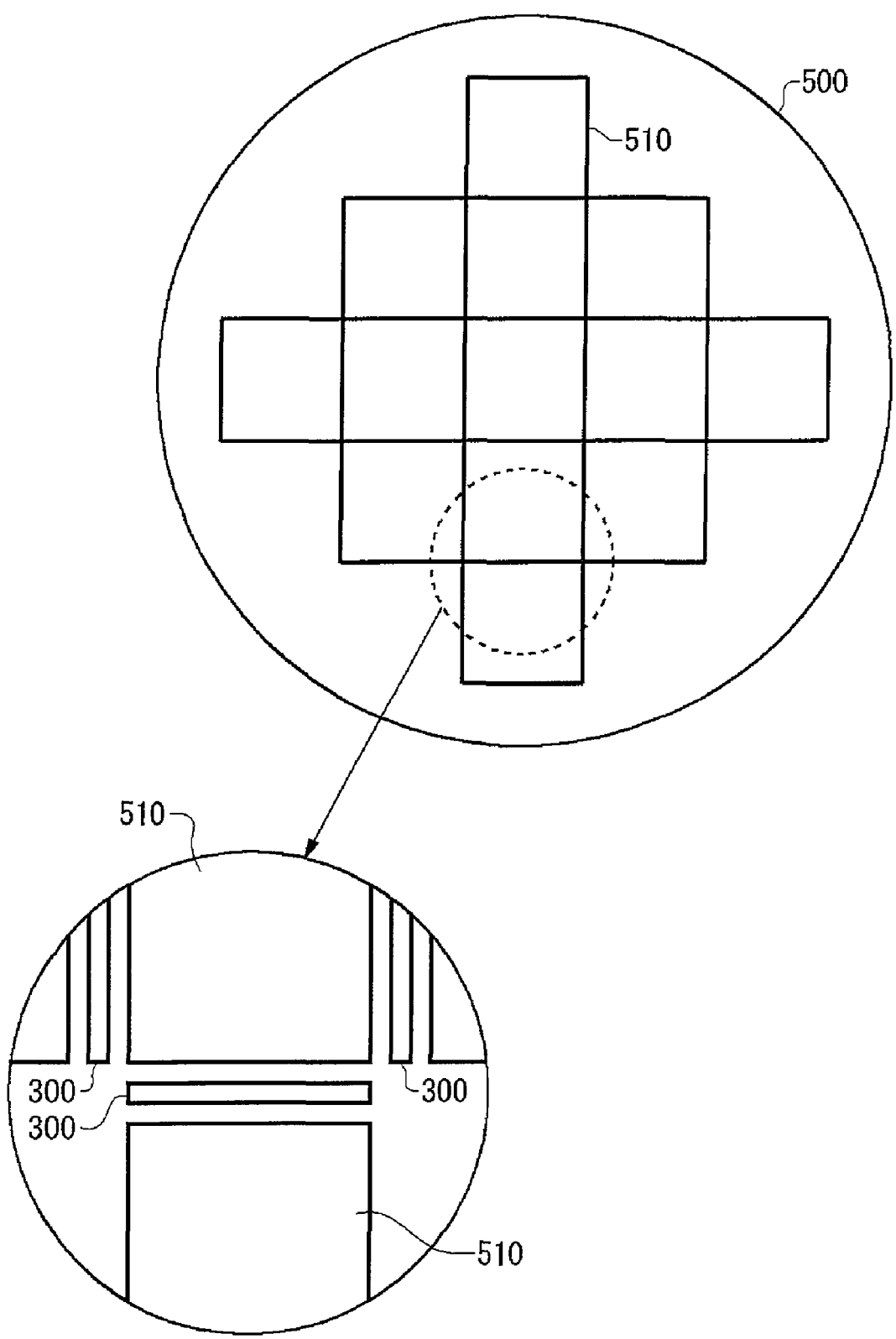
FIG. 3 illustrates, as an example, the upper surface of a wafer 500.

FIG. 3 illustrates, as an example, the upper surface of the wafer 500. The manufacturing line 100 may manufacture the wafer 500 that contains therein a plurality of test circuits 300 and a plurality of electronic devices 510, for the line management or yield management. Here, each test circuit 300 includes a plurality of transistors under measurement, and each electronic device 510 is to be shipped out as an actually-operating device, that is to say, a product. The test circuits 300 may be provided at all of the boundaries of the electronic devices 510. In this case, the test circuits 300 may be provided in the dicing regions between the electronic devices 510, which are removed when the wafer 500 is diced into the individual electronic devices 510. Alternatively, the test circuits 300 may be provided inside the electronic device 510. When used for the line management, the wafer 500 may have on the surface thereof the test circuits 300 only.

Figure 4:
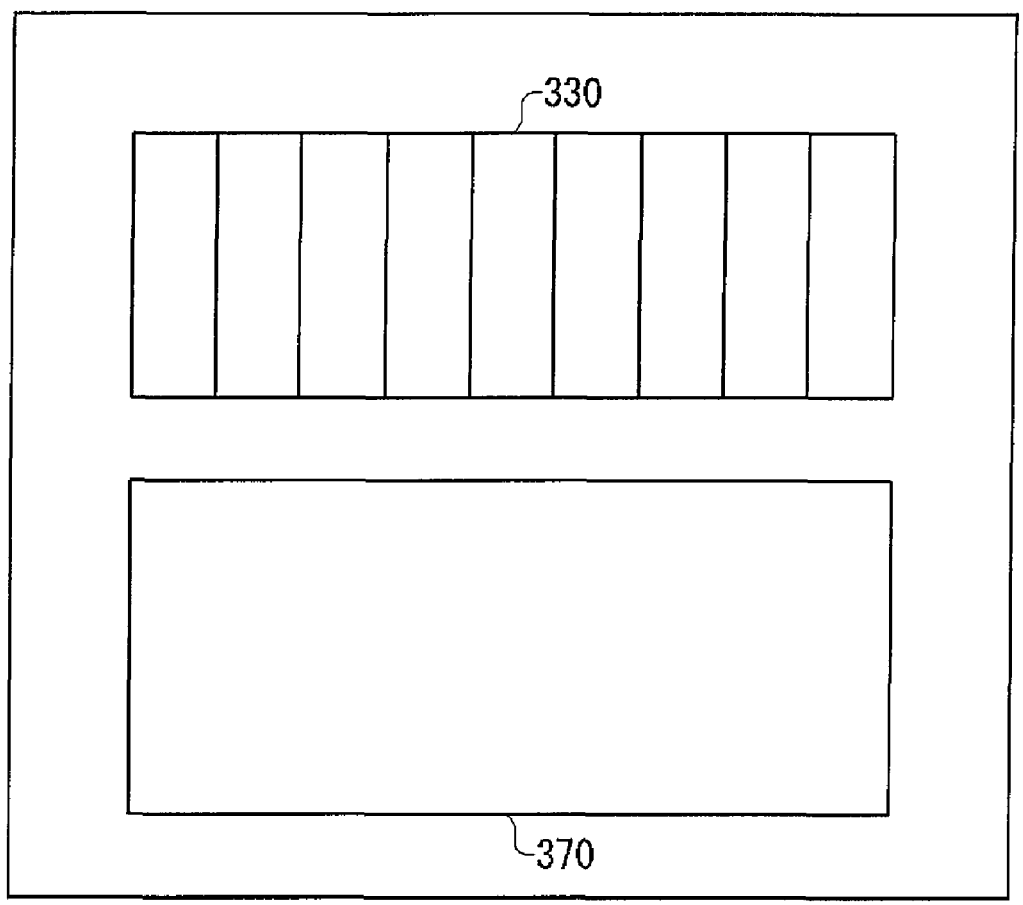
FIG. 4 illustrates an exemplary circuit layout of each test circuit 300.

FIG. 4 illustrates an exemplary circuit layout of each test circuit 300. Each test circuit 300 has a region 330 and a gate leakage current measuring region 370. In the region 330, a plurality of transistors under measurement are formed in compliance with the same processing rule and device size or different processing rules and device sizes. When a plurality of transistors under measurement are formed in the region 330 in compliance with a plurality of processing rules and device sizes, the region 330 is divided into a plurality of sub-regions adjacent to each other in the horizontal direction. In this way, one or more transistors under measurement may be formed in each sub-region by using a different processing rule and a different device size.

Figure 5:
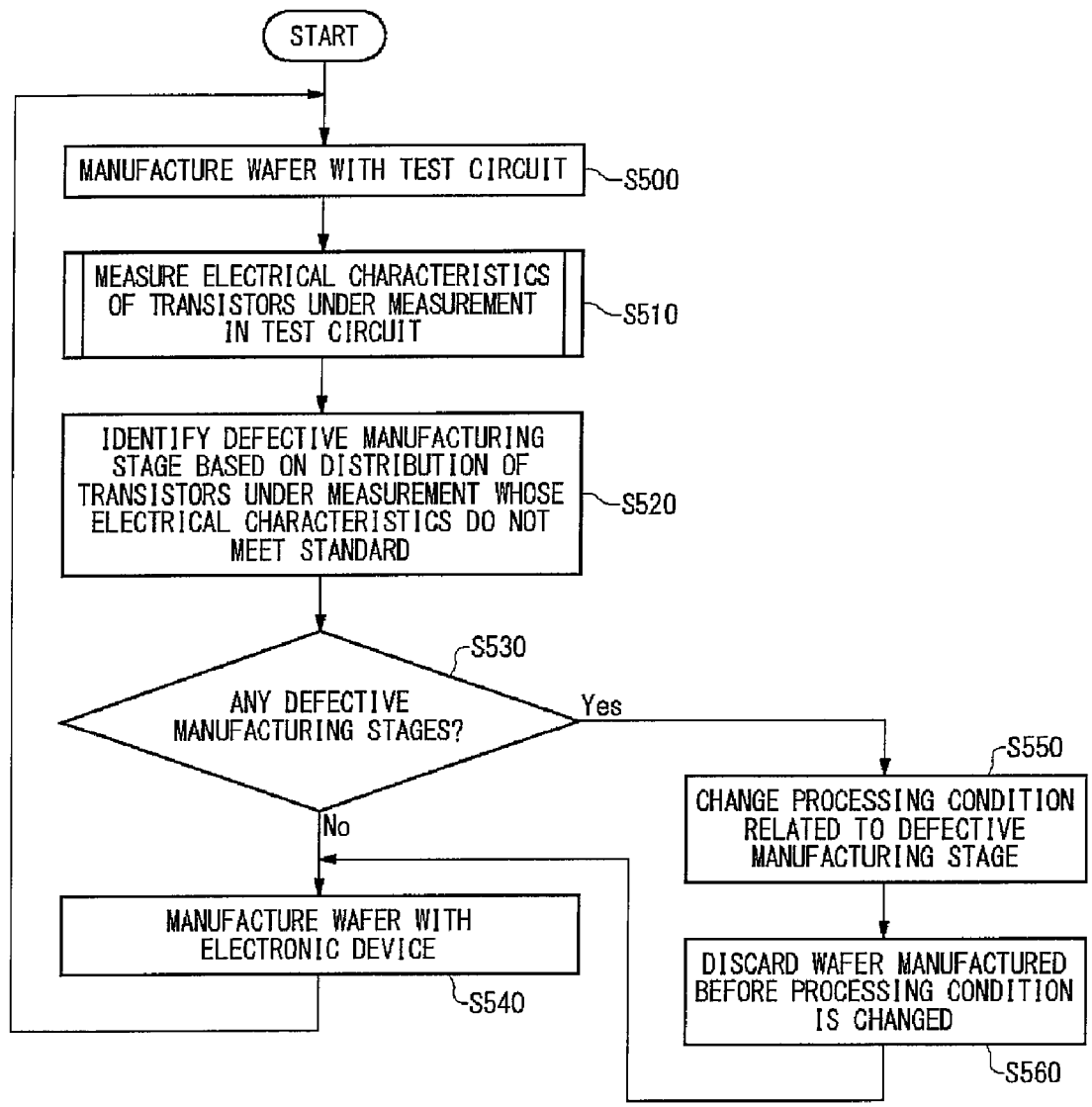
FIG. 5 illustrates an example of the manufacturing process carried out by the manufacturing system 10 for manufacturing electronic devices 510.

FIG. 5 illustrates an example of the manufacturing process carried out by the manufacturing system 10 for manufacturing the electronic devices 510. The processing flow shown in FIG. 5 is used to realize the line management of the manufacturing line 100.

To start with, the manufacturing control section 140 instructs the manufacturing line 100 to manufacture a wafer having therein a test circuit 300 which includes a plurality of transistors under measurement (step S500). In response to the instruction from the manufacturing control section 140, the manufacturing line 100 manufactures the wafer by using the plurality of manufacturing apparatuses 105.

Alternatively, the manufacturing line 100 may manufacture the wafer 500 containing therein one or more electronic devices 510 and one or more test circuits 300. If such is the case, the manufacturing line 100 may form on the wafer the electronic devices 510 in a lattice pattern, as shown in FIG. 3, during a device formation stage and form on the wafer the test circuits 300 in the regions between the electronic devices 510 during a test circuit formation stage.

Subsequently, the measuring section 145 measures the electrical characteristics of the transistors under measurement included in the test circuit 300 formed on the wafer (step S510). After this, the identifying section 150 attempts to identify, among the manufacturing stages, one or more manufacturing stages in which defects are generated, with reference to the distribution, on the wafer, of the transistors under measurement whose electrical characteristics do not meet the predetermined standard (step S520). Here, when the wafer has a plurality of test circuits 300 formed thereon, the measuring section 145 measures the electrical characteristics of the individual transistors under measurement within each test circuit 300 (step S510), and the identifying section 150 may attempt to identify the manufacturing stages in which defects are generated, with reference to the distribution, on the wafer, of the transistors under measurement (in the plurality of test circuits 300) whose electrical characteristics do not meet the predetermined standard (step S520).

When the identifying section 150 identifies no defective manufacturing stages (step S530: NO), the manufacturing line 100 manufactures a product wafer having therein an electronic device 510 (step S540). Following this, the manufacturing system 10 goes back to the step S500. In the above-described manner, the manufacturing line 100 can alternately manufacture one or more product wafers that have thereon an electronic device 510 but does not have thereon a test circuit 300 (step S540), and a test wafer that has thereon a test circuit 300 but does not have thereon an electronic device 510 (step S500). When the manufacturing line 100 manufactures a wafer that has thereon both an electronic device 510 and a test circuit 300, the stages S500 and S540 may be integrated into a single stage.

When the identifying section 150 identifies defective manufacturing stages (step S530: YES), the condition changing section 155 changes the processing conditions related to the manufacturing apparatuses 105 performing the processes corresponding to the identified manufacturing stages in which the defects are generated (step S550). When the defects are eliminated by changing the settings of the manufacturing apparatuses 105 (e.g. the parameters set for the manufacturing apparatuses 105), the setting changing section 160 in the condition changing section 155 changes the settings of the manufacturing apparatuses 105 performing the processes corresponding to the identified manufacturing stages in which the defects are generated.

After this, on condition that the identifying section 150 identifies the manufacturing stages in which the defects are generated, the discarding section 170 discards one or more product wafers which are manufactured from when a preceding test wafer is manufactured to when the processing conditions are changed (step S560). Here, the discarding section 170 may subject the discarded wafers to the recycling processing in order to remove the elements and wirings formed on the wafers, and throw the recycled wafers again into the manufacturing line 100 as new wafers.

After the condition changing section 155 has changed the processing conditions relating to one or more manufacturing apparatuses 105, the manufacturing line 100 manufactures a product wafer having thereon an electronic device 510 with the changed processing conditions (step S540).

According to the line management method represented by the above-described steps S500 to S530 and steps S550 to S560, the manufacturing system 10 can manufacture a wafer having thereon a test circuit 300, and identify one or more manufacturing stages in which defects are generated, with reference to the distribution, on the wafer, of the transistors under measurement which do not meet the standard. Additionally, the manufacturing system 10 can appropriately manage the quality of the manufacturing line 100 by changing the processing conditions related to the manufacturing apparatuses 105 corresponding to the identified defective manufacturing stages. According to the manufacturing method represented by the steps S500 to S560, the manufacturing line 100, whose quality is managed by using the above-described management method, can make it possible to manufacture accurate electronic devices 510 with a high yield.

Figure 6:
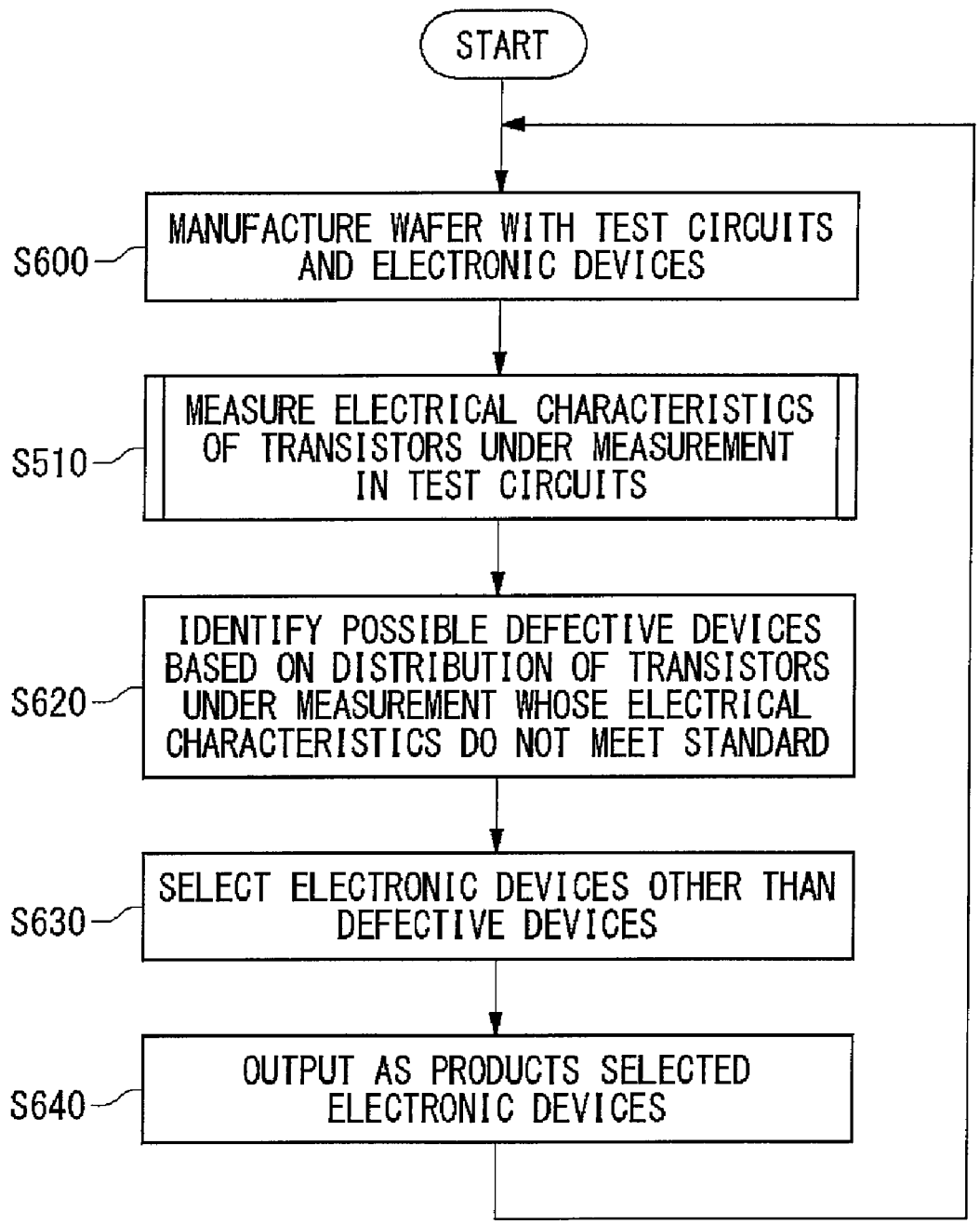
FIG. 6 illustrates a different example of the manufacturing process carried out by the manufacturing system 10 for manufacturing the electronic devices 510.

FIG. 6 illustrates a different example of the manufacturing process carried out by the manufacturing system 10 for manufacturing the electronic devices 510. The processing flow shown in FIG. 6 is used to realize the yield management of the electronic devices 510.

To start with, the manufacturing control section 140 instructs the manufacturing line 100 to manufacture the wafer 500 having therein the plurality of test circuits 300 and the plurality of electronic devices 510, where each test circuit 300 includes a plurality of transistors under measurement (step S600). Subsequently, the measuring section 145 measures the electrical characteristics of the transistors under measurement included in the test circuits 300 formed on the wafer (step S510). After this, the identifying section 150 identifies, among the electronic devices 510, one or more defective devices in which defects may occur, with reference to the distribution, on the wafer, of the transistors under measurement whose electrical characteristics do not meet the predetermined standard (step S620). Following this, the selecting section 165 selects, from the plurality of electronic devices 510, electronic devices 510 which are not the defective devices during the processing by the assembling stage group 120 (step S630). The assembling stage group 120 and the test stage group 130 together function as a product output section relating to the present invention. Specifically speaking, the assembling stage group 120 and the test stage group 130 perform the assembling processing and the test processing on the selected electronic devices 510, and output products (step S640).

According to the above-described manufacturing method, the manufacturing system 10 manufactures a wafer having thereon test circuits 300, and eliminates one or more electronic devices 510 in which defects may occur, with reference to the distribution on the wafer of the transistors under measurement which do not meet the standard. Therefore, the manufacturing system 10 can select acceptable electronic devices 510. As a result, the manufacturing system 10 can efficiently manage the yield of the electronic devices 510.

Figure 7:
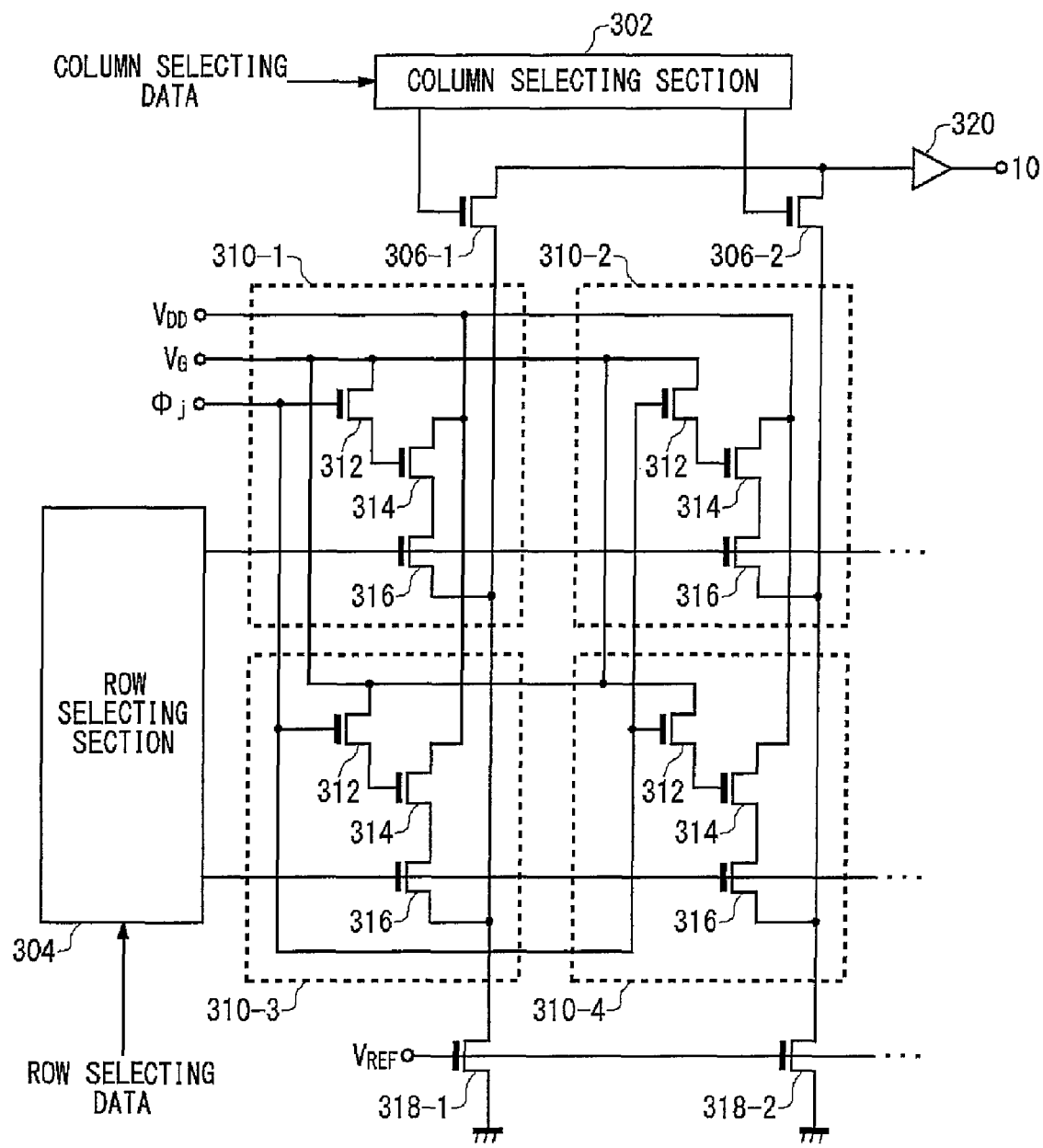
FIG. 7 illustrates an exemplary circuit in a region 330.

FIG. 7 illustrates, as an example, the region 330 of each test circuit 300. Each test circuit 300 having the configuration shown in FIG. 7 makes it possible for the measuring section 145 to efficiently measure the electrical characteristic of each of the many transistors under measurement 314. Therefore, when the quality of the manufacturing line 100 is not sufficiently high, the identifying section 150 can obtain a sufficient number of transistors under measurement whose electrical characteristics do not meet the standard. As a result, the identifying section 150 can identify one or more manufacturing stages in which defects are generated or one or more defective electronic devices 510, with reference to the distribution of the transistors under measurement whose electrical characteristics do not meet the standard.

In the region 330, each test circuit 300 has a column selecting section 302, a row selecting section 304, a plurality of column selecting transistors 306-1 and 306-2 (hereinafter collectively referred to as the column selecting transistors 306), a plurality of current sources 318-1 and 318-2 (hereinafter collectively referred to as the current sources 318), an output section 320, and a plurality of cells 310-1 to 310-4 (hereinafter collectively referred to as the cells 310). The column selecting transistors 306 are provided in a one-to-one correspondence with the columns in which the cells 310 are formed. Each test circuit 300 further includes the plurality of current sources 318-1 and 318-2 each of which provides a designated source-drain current to a cell 310, to which the row selecting section 304 has input a selection signal.

The cells 310 are shown as an example of the circuits under measurement relating to the present invention. The cells 310 are arranged in a two-dimensional matrix (in rows and columns) within the plane of the wafer 500. The cells 310 are connected in parallel with each other in the column and row directions of the two-dimensional matrix. According to each test circuit 300 relating to the present example, two cells 310 are arranged in each of the row and column directions. However, a larger number of cells 310 can be provided in each of the row and column directions. Here, the cells 310 are disposed in the sub-regions described with reference to FIG. 4. In each sub-region, for example, the cells 310 are arranged in 128 columns and 512 rows. If such is the case, the processing rules and device sizes of the elements included in the cells 310 may be different in units of the sub-regions.

Each cell 310 has a transistor under measurement 314, a switching transistor 312, and a row selecting transistor 316. The transistors in each cell 310 may be MOS transistors which are formed by the same process as the actually-operating transistors included in the electronic devices 510.

The transistors under measurement 314 of the cells 310 are electrically connected to each other in parallel. In the following description of the present embodiment, the transistors under measurement 314 are assumed to be NMOS transistors, for example. Alternatively, the transistors under measurement 314 may be PMOS transistors. In this case, the sources and drains may be switched with each other.

A predetermined reference voltage $V_{DD}$ is input into one of the drain and source terminals of each transistor under measurement 314 (the reference voltage terminal). A wiring in each cell 310 which supplies the reference voltage input into the cell 310 from outside to the reference voltage terminal of the transistor under measurement functions as a reference voltage input section relating to the present invention. The reference voltage terminal may be the drain terminal when each transistor under measurement 314 is an NMOS transistor, and the source terminal when each transistor under measurement 314 is a PMOS transistor. FIG. 7 does not show the terminal of each transistor under measurement 314 to which a well voltage is supplied. However, the well voltage terminal of each transistor under measurement 314 may be connected to a ground potential. Alternatively, when the well voltage to be supplied to each transistor can be independently controlled, the well voltage terminal of each transistor under measurement 314 may be connected to the corresponding source terminal. Here, the voltages $V_{DD}$, $V_G$, $\phi_j$, $V_{REF}$ shown in FIG. 7 may be supplied from the measurement control section 146 shown in FIG. 2 to each test circuit 300.

The switching transistor 312 of each cell 310 is provided in correspondence with the transistor under measurement 314 of the cell 310. Each switching transistor 312 functions as a gate voltage control section that applies the gate voltage designated by the measurement control section 146 to the gate terminal of the corresponding transistor under measurement 314. When each switching transistor 312 is an NMOS transistor in the present embodiment, each switching transistor 312 receives at the drain terminal thereof the predetermined voltage $V_G$, receives at the gate terminal thereof the voltage $\phi_j$ for controlling the operation of the switching transistor 312, and is connected at the source terminal thereof to the gate terminal of the corresponding transistor under measurement 314. Which is to say, when turned on by the voltage $\phi_j$, each switching transistor 312 applies a voltage substantially equal to the voltage $V_G$ to the gate terminal of the corresponding transistor under measurement 314. On the other hand, when turned off by the voltage $\phi_j$, each switching transistor 312 applies a fluctuating voltage whose initial voltage is substantially equal to the voltage $V_G$ to the gate terminal of the corresponding transistor under measurement 314.

In the example shown in FIG. 7, the voltage $\phi_j$ is collectively applied to all of the cells 310. According to other examples, however, the voltage $\phi_j$ may be sequentially applied from the row selecting section 304 to each group of cells 310 which are arranged adjacent to each other in the row direction, in the form of a pulse signal. This is to achieve the same duration for the leakage time in every cell when the P-N junction leakage current is measured.

The row selecting transistor 316 in each cell 310 is provided in correspondence with the transistor under measurement in the cell 310. Each row selecting transistor 316 functions as a terminal voltage output section that, on condition that the selection signal is input into the corresponding cell 310 from outside, outputs the terminal voltage of the terminal which is not the reference voltage terminal and is selected from the drain and source terminals of the corresponding transistor under measurement 314, as an output signal. When each row selecting transistor 316 is a PMOS transistor in the present example, the source terminal of each row selecting transistor 316 is connected to the drain terminal of the corresponding transistor under measurement 314. Additionally, the drain terminal of each row selecting transistor 316 is connected to the drain terminal of the corresponding column selecting transistor 306. Which is to say, the drain terminal of each column selecting transistor 306 is connected to the drain terminals of corresponding row selecting transistors 316.

The row selecting section 304 outputs a selection signal to a group of cells 310 corresponding to the selected row, from among the plurality of cells 310 arranged in the two-dimensional matrix. In this way, the row selecting section 304 sequentially selects a plurality of cell groups each of which is constituted by a plurality of cells 310 arranged adjacent to each other in the row direction (in the present example, the cell group including the cells 310-1 and 310-2 and the cell group including the cells 310-3 and 310-4). Additionally, the column selecting section 302 selects, from the two or more cells 310 forming the row to which the selection signal has been input, a cell 310 corresponding to a designated column, and causes the output signal line to output the terminal voltage of the selected cell 310. In this way, the column selecting section 302 sequentially selects a plurality of cell groups each of which is constituted by a plurality of cells 310 arranged adjacent to each other in the column direction (in the present example, the cell group including the cells 310-1 and 310-3 and the cell group including the cells 310-2 and 310-4). Being configured in the above-described manner, the row selecting section 304 and the column selecting section 302 together sequentially select the individual cells 310.

According to the present example, the row selecting section 304 sequentially turns on the row selecting transistors 316 corresponding to each row, which is determined by the row selection data supplied to the row selecting section 304 from the measurement control section 146. The column selecting section 302 sequentially turns on the column selecting transistor 306 corresponding to each column, which is determined by the column selection data supplied to the column selecting section 302 from the control section 14. In this way, the column selecting section 302 and the row selecting section 304 together function as a selecting section relating to the present invention. The column selecting section 302 and the row selecting section 304 can cause an output signal from a cell 310 designated by the measurement control section 146 to be output via an output signal line and the output section 320. Here, the output signal line is provided in common to the plurality of cells 310, and connects the row selecting transistors 306 to the output section 320.

The measurement control section 146 supplies the selection signals configured to sequentially select the individual cells 310 to the row selecting section 304 and column selecting section 302. The column selecting section 302 and row selecting section 304 may include circuits such as decoders and shift registers which convert the column selection data and the row selection data supplied thereto into the selection signals indicating the position of a cell 310 to be selected. Here, the selection signals are designed to turn on the column selecting transistor 306 and the row selecting transistor 316, which correspond to the cell 310 to be selected in accordance with the selection data.

With the above-described configuration, the measurement control section 146 sequentially selects the transistor under measurement 314 provided in each cell 310. As a result, the terminal voltage of the selected transistor under measurement 314 is sequentially output to the output section 320. The output section 320 sequentially outputs the terminal voltage to the test head 10. The output section 320 may be a voltage follower buffer, for example. By using the terminal voltage of each transistor under measurement 314, the measuring section 145 measures the electrical characteristic of the transistor under measurement 314, such as the threshold voltage, the current-voltage characteristic, low-frequency noise, and P-N junction leakage current.

Each current source 318 is a MOS transistor which receives at the gate terminal thereof the predetermined voltage $V_{REF}$. The drain terminal of each current source 318 is connected to the drain terminals of the corresponding row selecting transistors 316. In other words, each current source 318 is provided in correspondence with a plurality of transistors under measurement 314 within the same column, and defines the source-drain currents flowing through the corresponding transistors under measurement 314.

According to the circuit structure shown in FIG. 7, each of the plurality of transistors under measurement 314 is sequentially selected electrically in each test circuit 300, and the terminal voltage of the selected transistor under measurement 314 can be sequentially output. Therefore, the measuring section 145 can measure the terminal voltages of the respective transistors under measurement 314 at high speed within a short time. Consequently, even when a large number of transistors under measurement 314 are formed in the wafer 500, the measuring section 145 can complete measuring the electrical characteristics of all the transistors under measurement 314 within a short time. In the present example, the number of transistors under measurement 314 provided within the surface of the wafer 500 may reach approximately 10,000 to 10,000,000. By measuring the electrical characteristics of such a large number of transistors under measurement 314, the present embodiment can accurately calculate the unevenness of the characteristics among the transistors under measurement 314.

Figure 8:
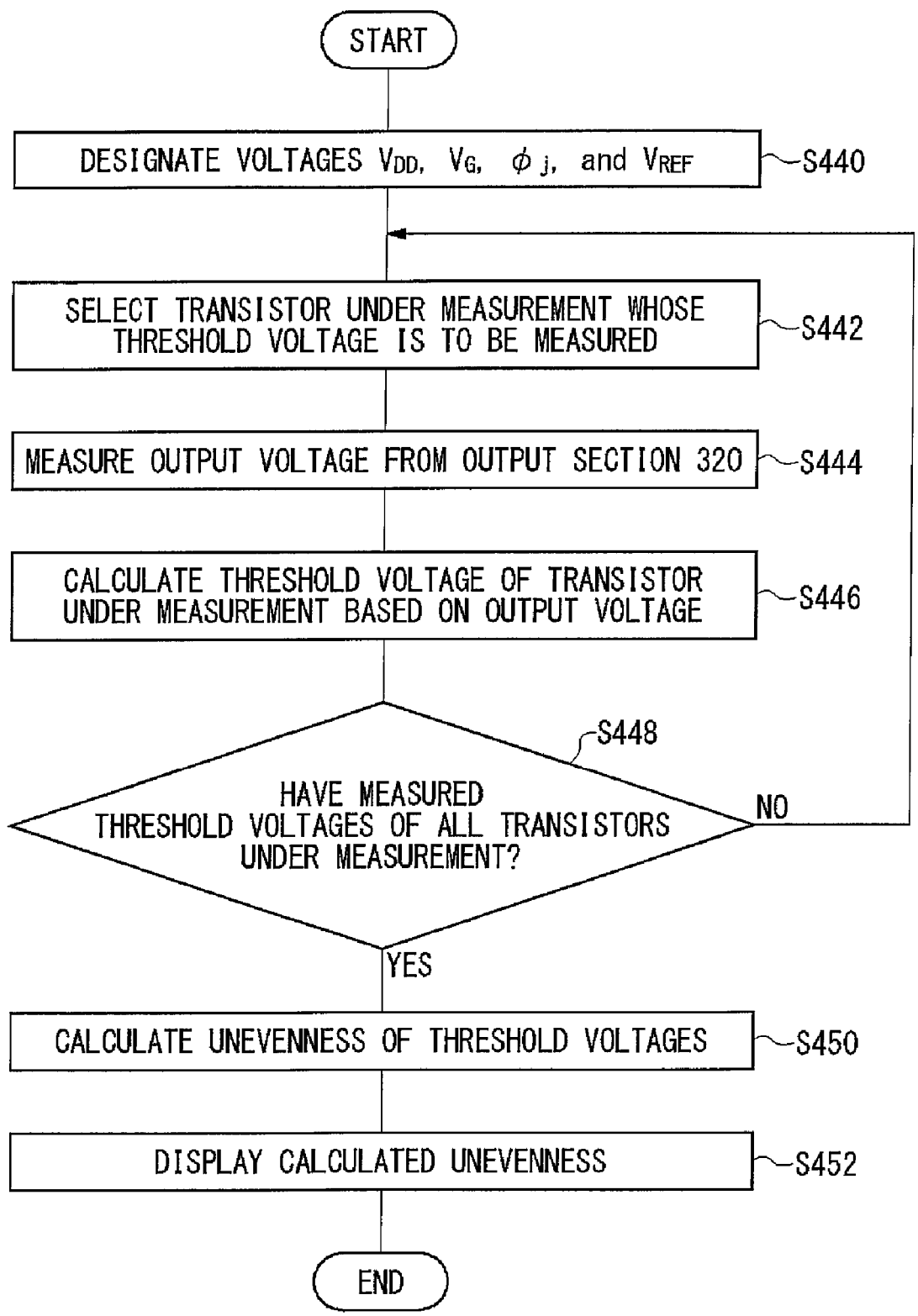
FIG. 8 illustrates an exemplary operation of the measuring section 145, when the threshold voltages of transistors under measurement 314 are measured.

FIG. 8 illustrates an exemplary operation of the measuring section 145, when the measuring section 145 measures the threshold voltages of the respective transistors under measurement 314 in the step S510 of FIGS. 5 and 6.

The measurement control section 146 supplies the voltages $V_{DD}$, $V_G$, $\phi_j$, and $V_{REF}$ described with reference to FIG. 7 to each test circuit 300 (step S440). Here, the measurement control section 146 functions as a current control section that supplies the constant voltage $V_{REF}$ to each current source 318 and causes each current source 318 to generate the same constant current. The measurement control section 146 also supplies the gate voltage $V_G$ to turn on the transistors under measurement 314, and supplies the voltage $\phi_j$ to turn on the switching transistors 312. As a result of the above controls, the measurement control section 146 functions as a gate control section that applies the gate voltage to turn on each transistor under measurement 314 to the gate terminal of the transistor under measurement 314.

After this, the measurement control section 146 supplies the selection data to select a transistor under measurement 314 whose threshold voltage is to be measured, to the column selecting section 302 and the row selecting section 304 (step S442). In this manner, the measurement control section 146 sequentially selects the cells 310 by means of the column selecting section 302 and the row selecting section 304. The ADC 12 then measures the output voltage from the output section 320 (step S444). In this manner, the ADC 12 can measure the electrical characteristic of the transistor under measurement 314 in each cell 310, based on the output signal output from the selected cell 310 onto the output signal line. The ADC 12 may notify the measurement control section 146 that the output voltage has been measured. When receiving the notification, the measurement control section 146 may select the next transistor under measurement 314.

Subsequently, the characteristics measuring section 16 calculates the threshold voltage of each transistor under measurement 314 based on the gate voltage $V_G$ applied to the transistor under measurement 314 and the output voltage from the output section 320 (step S446). The threshold voltage of the transistor under measurement 314 can be obtained, for example, by calculating the difference between the gate voltage $V_G$ and the output voltage, that is to say, the gate-source voltage of the transistor under measurement 314.

After this, the measurement control section 146 judges whether the characteristics measuring section 16 has measured the threshold voltages of all the transistors under measurement 314 (step S448). When there are transistors under measurement 314 whose threshold voltages have not been measured, the measurement control section 146 selects the next transistor under measurement 314. Following this, the operations in the steps S444 and S446 are repeated. When having calculated the threshold voltages of all of the transistors under measurement 314, the characteristics measuring section 16 calculates the unevenness of the threshold voltages (S450). The display apparatus 18 displays thereon the unevenness of the threshold voltages which is calculated by the characteristics measuring section 16 (step S452). For example, the display apparatus 18 may display on the screen thereof the upper surface of the wafer, and display the electrical characteristic of each transistor under measurement 314 at the position on the screen corresponding to the transistor under measurement 314.

By operating in the above-described manner, the measuring section 145 can efficiently measure the unevenness of the threshold voltages of the transistors under measurement 314. Additionally, the measuring section 145 can measure the unevenness of the threshold voltages of the transistors under measurement 314, in association with each processing rule. By performing the above-described measuring process on the plurality of test circuits 300 formed on the wafer 500, the measuring section 145 can measure the unevenness of the threshold voltages on the entire surface of the wafer 500.

Figure 9:
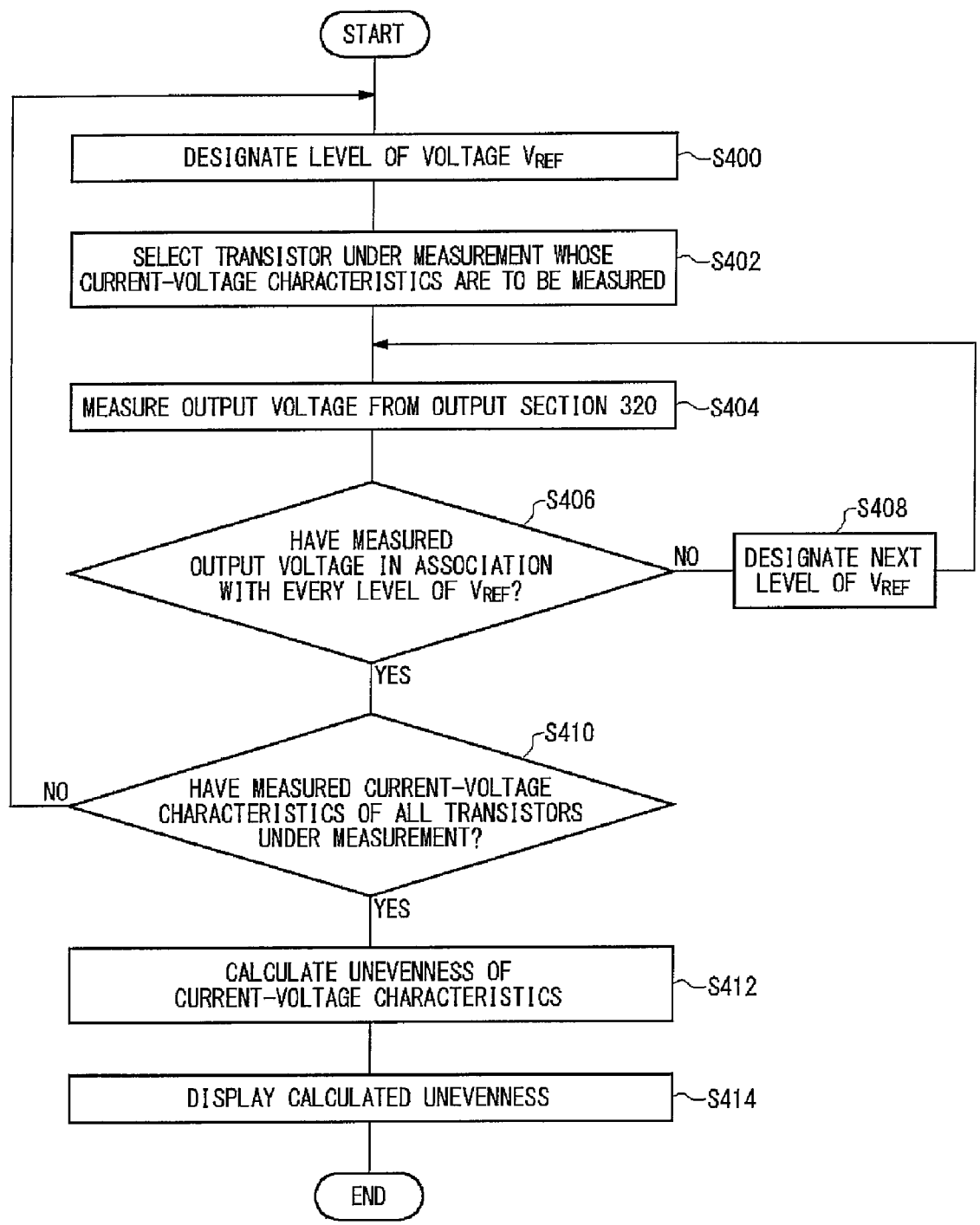
FIG. 9 illustrates an exemplary operation of the measuring section 145, when the current-voltage characteristics of the transistors under measurement 314 are measured.

FIG. 9 illustrates an exemplary operation of the measuring section 145, when the measuring section 145 measures the current-voltage characteristic of each transistor under measurement 314 in the step S510 of FIGS. 5 and 6.

The measurement control section 146 supplies the voltages $V_{DD}$, $V_G$, $\phi_j$ and $V_{REF}$ explained with reference to FIG. 7 to each test circuit 300 (step S400). Specifically speaking, the measurement control section 146 supplies the constant voltage $V_{REF}$ to each current source 318, and causes each current source 318 to generate the same constant current. The measurement control section 146 supplies the gate voltage $V_G$ to turn on the transistors under measurement 314, and supplies the voltage $\phi_j$ to turn on the switching transistors 312.

After this, the measurement control section 146 supplies the selection data to select a transistor under measurement 314 whose current-voltage characteristic is to be measured, to the column selecting section 302 and the row selecting section 304 (step S402). The measurement control section 146 then varies the voltage $V_{REF}$ within a predetermined range with a predetermined resolution (steps S406 to S408). While the voltage $V_{REF}$ is varied, the ADC 12 measures the output voltage from the output section 320 in association with each level of the voltage $V_{REF}$ (step S404). In other words, the measuring section 145 sequentially varies the source-drain current generated by each current source 318, and measures the source voltage of the selected transistor under measurement 314 in association with each level of the source-drain current. In the above-described manner, the measuring section 145 can measure the current-voltage characteristic of the selected transistor under measurement 314.

The measuring section 145 judges whether the current-voltage characteristics of all the transistors under measurement 314 have been measured (step S410). When there are one or more transistors under measurement 314 whose current-voltage characteristics have not been measured, the measuring section 145 repeats the sequence of the steps S400 to S410. Note that, in the step S402, the measuring section 145 selects the next transistor under measurement 314.

When the measuring section 145 has measured the current-voltage characteristics of all the transistors under measurement 314, the characteristics measuring section 16 calculates the unevenness of the current-voltage characteristics (step S412). For example, the characteristics measuring section 16 may calculate the mutual capacitances gm of the respective current-voltage characteristics, and calculate the unevenness of the mutual capacitances gm. Alternatively, the characteristics measuring section 16 calculates the gradient swings and the interface state densities of the silicon gate insulation films based on the current-voltage characteristics in the sub-threshold region, and then calculates the unevenness. The display apparatus 18 displays thereon the unevenness of the characteristics which is calculated by the characteristics measuring section 16 (step S414).

Figure 10:
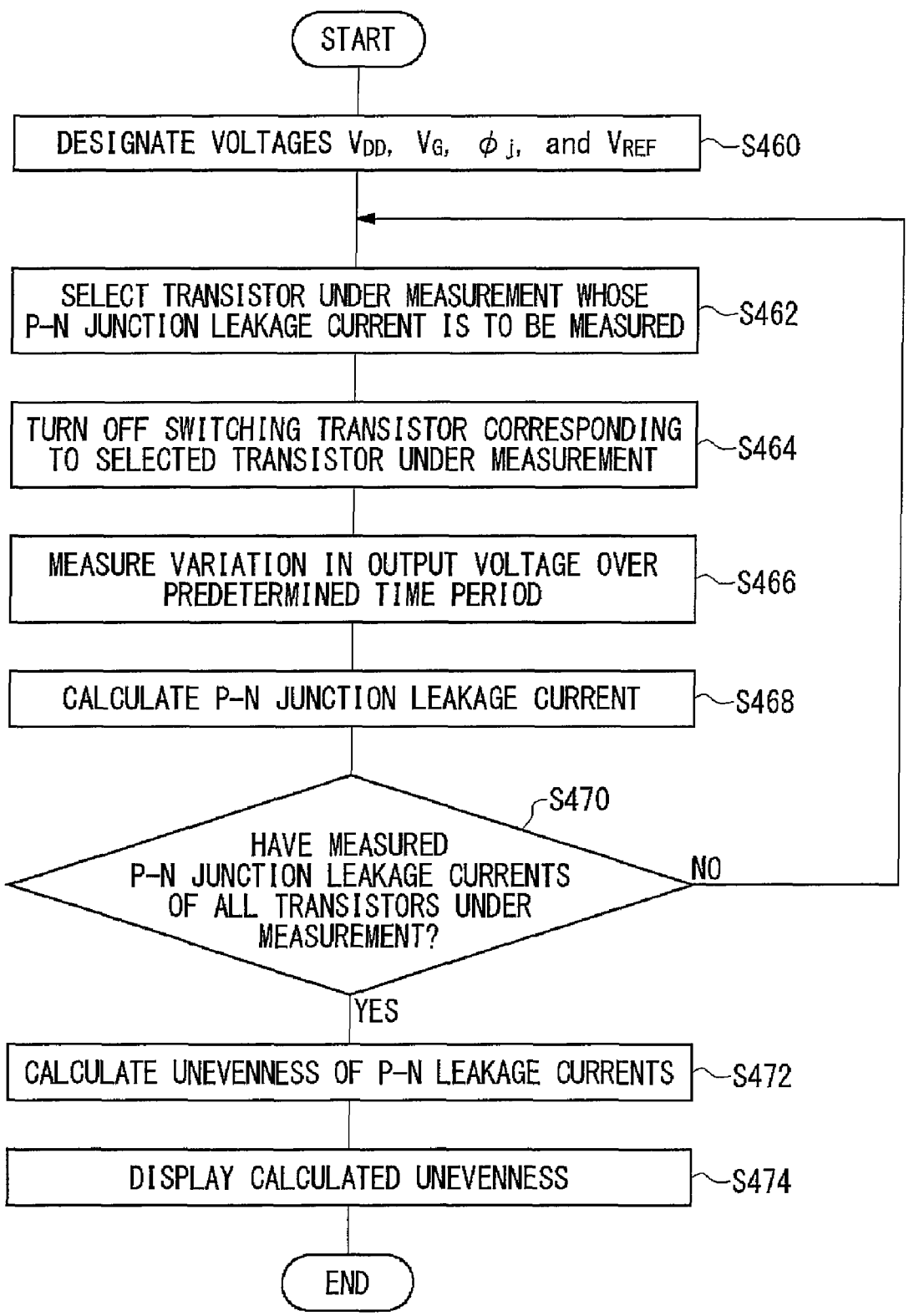
FIG. 10 illustrates an exemplary operation of the measuring section 145, when the P-N junction leakage currents of cells 310 are measured.

FIG. 10 illustrates an exemplary operation of the measuring section 145, when the measuring section 145 measures the P-N junction leakage current of each cell 310 in the step S510 of FIGS. 5 and 6.

Each switching transistor 312 has a P-N junction connected to the gate terminal of the corresponding transistor under measurement 314. In the present example, the measuring section 145 measures the leakage current at such a P-N junction.

The measurement control section 146 supplies the voltages $V_{DD}$, $V_G$, $\phi_j$ and $V_{REF}$ explained with reference to FIG. 7 to each test circuit 300 (step S460). Specifically speaking, the measurement control section 146 supplies the constant voltage $V_{REF}$ to each current source 318, and causes each current source 318 to generate the same constant current. The measurement control section 146 supplies the gate voltage $V_G$ to turn on the transistors under measurement 314, and supplies the voltage $\phi_j$ to turn on the switching transistors 312. Additionally, the measuring section 145 causes the row selecting section 304 to sequentially supply a pulse signal to each group of cells 310 which are arranged adjacent to each other in the row direction, to achieve the same duration, among all the cells, for the leakage current measuring period.

After this, the measurement control section 146 supplies the selection data to select a transistor under measurement 314 whose P-N junction leakage current is to be measured, to the column selecting section 302 and the row selecting section 304 (step S462). Subsequently, the measurement control section 146 turns off the switching transistor 312 corresponding to the selected transistor under measurement 314 (step S464). In other words, the measurement control section 146 causes the switching transistor 312 to sequentially apply the gate voltage to turn on the corresponding transistor under measurement 314 and the gate voltage to turn off the corresponding transistor under measurement 314, to the corresponding transistor under measurement 314.

The characteristics measuring section 16 measures the source voltage of the transistor under measurement 314 when the transistor under measurement 314 is turned on and when a predetermined time has elapsed after the transistor under measurement 314 is turned off (step S466). In the present example, the characteristics measuring section 16 measures the variation of the output voltage from the output section 320 over the above-mentioned predetermined time.

Subsequently, the characteristics measuring section 16 calculates the leakage current at the P-N junction based on the measured variation of the source voltage (step S468). When the switching transistor 312 is turned on, the charges corresponding to the gate voltage are accumulated in the gate capacitance of the transistor under measurement 314. When the switching transistor 312 is turned off, the charges in the gate capacitance are discharged by the leakage current at the P-N junction. Therefore, the leakage current at the P-N junction can be measured in the form of the variation in the source voltage of the transistor under measurement 314 over the predetermined time.

Subsequently, the measuring section 145 judges whether the P-N junction leakage currents of all the transistors under measurement 314 have been measured (step S470). When there are one or more transistors under measurement 314 whose P-N junction leakage currents have not been measured, the measuring section 145 repeats the sequence of the steps S462 to S470. Note that, in the step S462, the measuring section 145 selects the next transistor under measurement 314.

When the P-N junction leakage currents of all the transistors under measurement 314 have been measured, the characteristics measuring section 16 calculates the unevenness of the P-N junction leakage currents (step S472). The display apparatus 18 displays thereon the unevenness of the characteristics which is calculated by the characteristics measuring section 16 (step S474).

Figure 11:
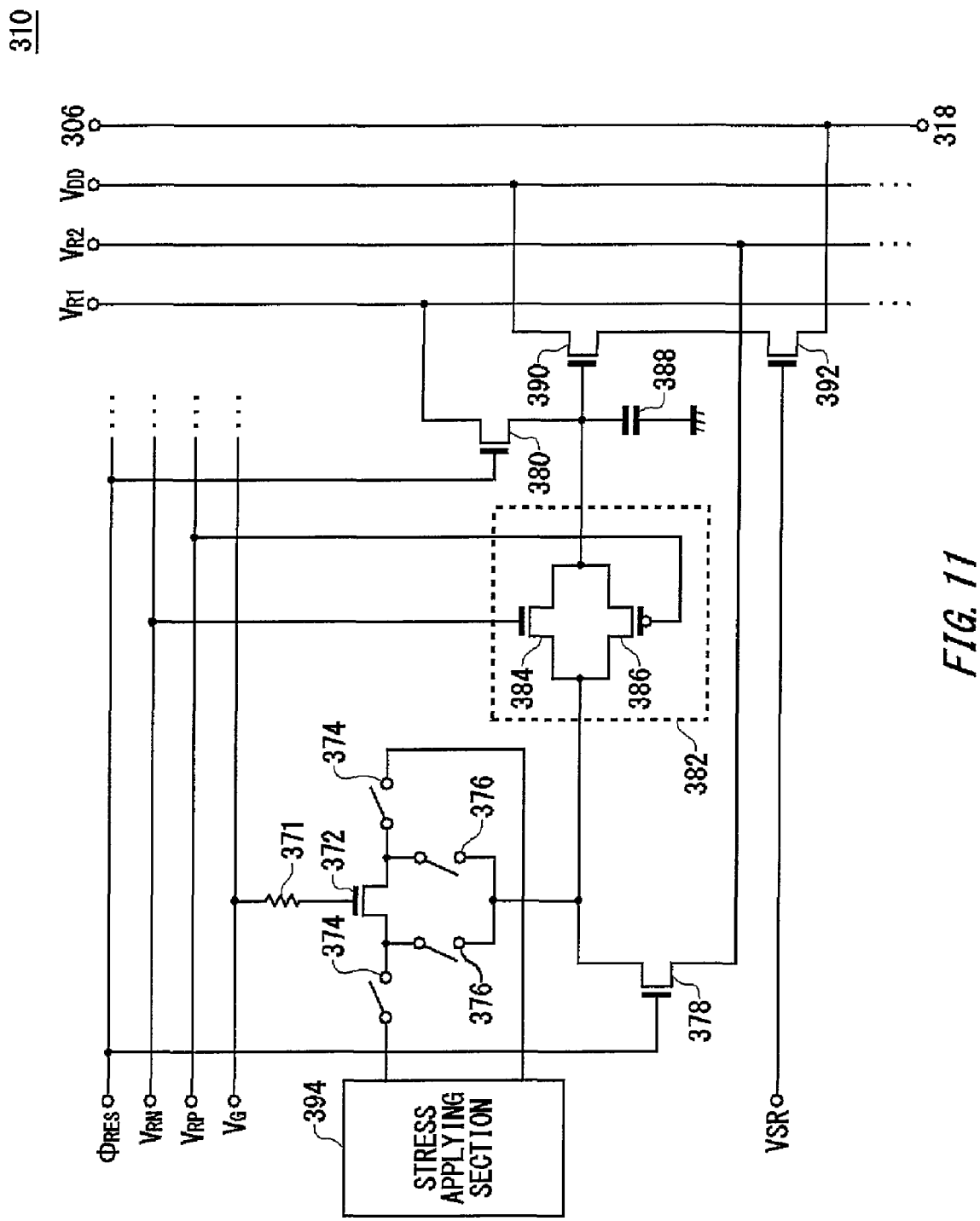
FIG. 11 illustrates an exemplary circuit configuration of a cell 310 provided in a gate leakage current measuring region 370.

FIG. 11 illustrates an exemplary circuit configuration of a cell 310 provided in the gate leakage current measuring region 370. In the circuit configuration relating to the present example, an electrical stress is applied to a transistor under measurement 372, and the gate leakage current of the transistor under measurement 372 charges and discharges a capacitor 388, with a constant electric field being applied to the gate insulation film of the transistor under measurement 372. The measuring section 145 calculates the gate leakage current of the transistor under measurement 372 with reference to the variation in the voltage value of the capacitor 388 over a predetermined time.

The circuit configuration is different between the gate leakage current measuring region 370 and the region 330, in terms of the configuration of each cell 310. FIG. 11 illustrates the configuration of each cell 310 provided in the gate leakage current measuring region 370. Here, FIG. 11 does not show the column selecting section 302, the row selecting section 304, the column selecting transistors (306-1 and 306-2, hereinafter collectively referred to as the column selecting transistors 306), the current sources (318-1 and 318-2, hereinafter collectively referred to as the current sources 318), and the output section 320, since these constituents are the same as described with reference to FIG. 7.

Each cell 310 includes a stress applying section 394, a transistor under measurement 372, a gate voltage control section 371, first switches 374, second switches 376, a voltage applying section 382, a capacitor 388, a row selecting transistor 392, reset transistors 378 and 380, and an output transistor 390.

The stress applying section 394 applies an electric stress to the gate insulation film of the transistor under measurement 372 via the first switches 374. For example, when the transistor under measurement 372 is assumed to be used as a storage element of a flash memory, the stress applying section 394 applies a voltage for data writing and erasing to the transistor under measurement 372.

When applying the stress to the transistor under measurement 372, the stress applying section 394 turns on the first switches 374, so that the source and drain terminals of the transistor under measurement 372 are connected to the stress applying section 394. Here, the measurement control section 146 turns off the second switches 376. In this manner, the stress applying section 394 can apply desired voltages to the respective terminals of the transistor under measurement 372, thereby applying the stress to the transistor under measurement 372.

According to the present example, the stress applying section 394 applies, to the transistor under measurement 314, the following four different stresses independently or sequentially.
(1) FN (Fowler-Nordheim) Gate Injection
(2) FN Substrate Injection
(3) Hot Electron Injection
(4) Source Erase According to the above-mentioned stresses (1) to (4), the stress applying section 394 applies the stress to the transistor under measurement 372 by writing/erasing data into/from the transistor under measurement 372. The stress applying section 394 may apply, to each terminal of the transistor under measurement 372, the voltage which is to be applied during the actual operation to write or erase data into/from the transistor under measurement 372. Alternatively, the stress applying section 394 may apply, to each terminal of the transistor under measurement 372, a voltage higher than the voltage which is to be applied during the actual operation.

The measurement control section 146 supplies a reset signal $\phi_{RES}$, the control voltages $V_{RN}$, $V_{RP}$, $V_{R1}$, $V_{R2}$, and $V_{DD}$, and the gate voltage $V_G$ to the cell 310. The gate voltage control section 371 applies the predetermined gate voltage $V_G$ supplied from the measurement control section 146 to the gate terminal of the transistor under measurement 372.

The second switches 376 establish or cut off the connection between the source and drain terminals of the transistor under measurement 372 and the capacitor 388 via the voltage applying section 382. The voltage applying section 382 applies a constant voltage to the source and drain terminals of the transistor under measurement 372 via the second switches 376. When the measurement control section 146 turns on the second switches 376, the voltage generated by the voltage applying section 382 is applied to the source and drain terminals of the transistor under measurement 372. Which is to say, the voltage applying section 382 applies a constant voltage to the source and drain terminals of the transistor under measurement 372, thereby causing a substantially constant electric field to be applied to the gate insulation film of the transistor under measurement 372.

The voltage applying section 382 includes a NMOS transistor 384 and a PMOS transistor 386. The NMOS transistor 384 receives the gate voltage $V_{RN}$ corresponding to the voltage to be applied to the source and drain terminals of the transistor under measurement 372. The NMOS transistor 384 is connected at the source terminal thereof to the source and drain terminals of the transistor under measurement 372 via the second switches 376, and connected at the drain terminal thereof to the capacitor 388. The PMOS transistor 386 is provided in parallel with the NMOS transistor 384, and receives the gate voltage $V_{RP}$ corresponding to the voltage to be supplied to the source and drain terminals of the transistor under measurement 372. The PMOS transistor 386 is connected at the drain terminal thereof to the source and drain terminals of the transistor under measurement 372 via the second switches 376, and connected at the source terminal thereof to the capacitor 388. The NMOS and PMOS transistors 384 and 386 function to maintain the voltage applied between the gate and the source or between the gate and the drain of the transistor under measurement 372 at a substantially constant level even if the potential of the capacitor 388 varies as a result of the accumulation of the gate leakage current at the capacitor 388.

With the above-described configuration, a constant electric field can be applied to the gate insulation film of the transistor under measurement 372, and the gate leakage current of the transistor under measurement 372 can charge and discharge the capacitor 388, irrespective of whether the transistor under measurement 372 is P or N type.

The capacitor 388 is charged or discharged by the gate leakage current which is output through the source and drain terminals of the transistor under measurement 372. Which is to say, the capacitor 388 accumulates the gate leakage current flowing from the gate terminal to the source and drain terminals, and converts the accumulated gate leakage current into a voltage value. The reset transistors 378 and 380 initialize the voltage value of the capacitor 388 to a predetermined voltage $V_{R1}$ on reception of the reset signal $\phi_{RES}$ at the gate terminals thereof.

The output transistor 390 receives at the gate terminal thereof the voltage provided by the capacitor 388, and outputs the source voltage determined by the received voltage. The row selecting transistor 392 outputs the source voltage of the output transistor 390 to the column selecting transistor 306, on condition that the row selecting transistor 392 receives the selection signal from the row selecting section 304. In this way, the output transistor 390 and the row selecting transistor 392 can function as a capacitor voltage output section that outputs the capacitor voltage at one end of the capacitor 388 which is closer to the source and drain terminals, as an output signal.

Figure 12:
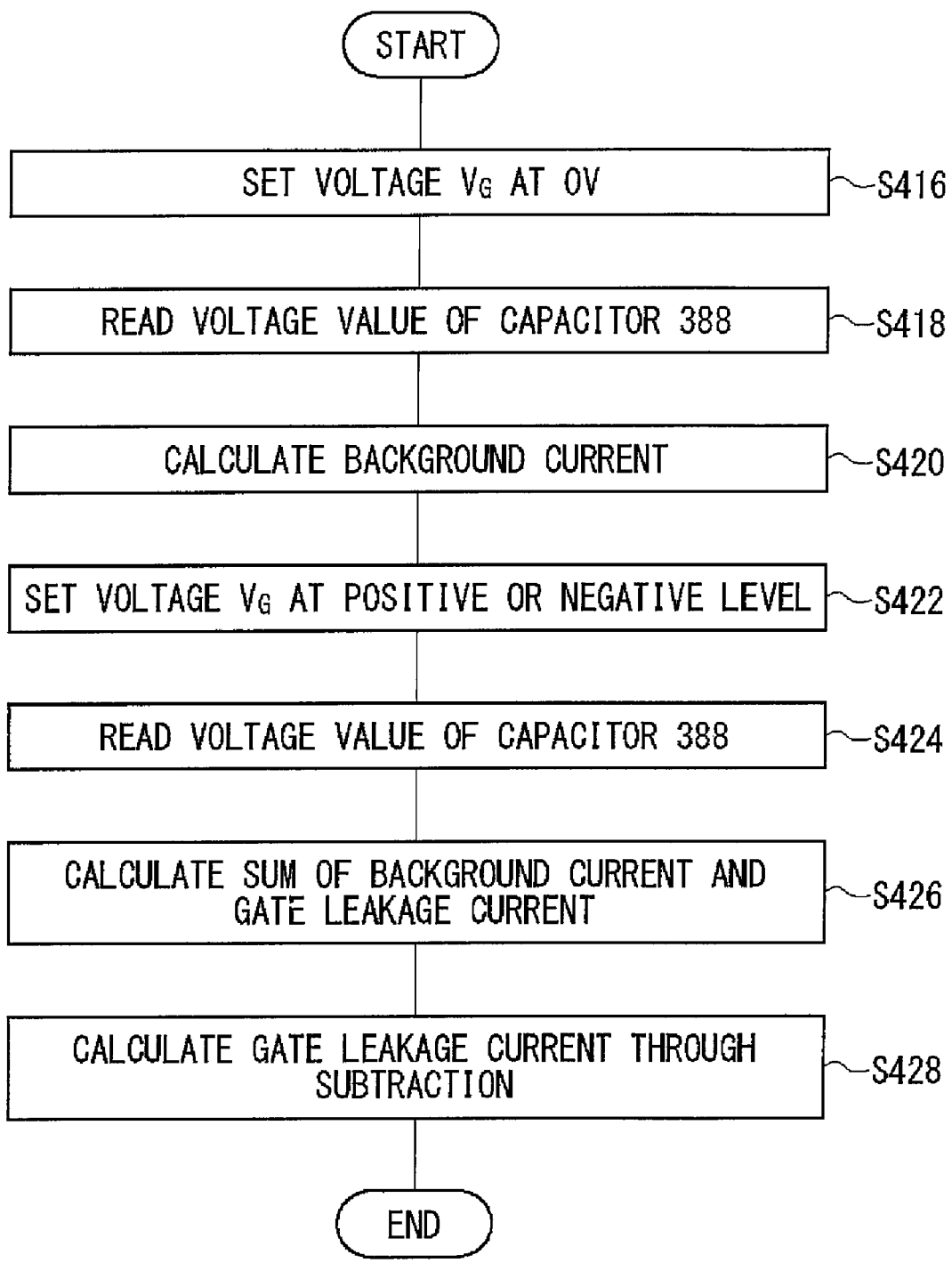
FIG. 12 illustrates an exemplary operation of the manufacturing system 10, when the gate leakage current of a transistor under measurement 372 is measured.

FIG. 12 illustrates an exemplary operation of the manufacturing system 10, when the measuring section 145 measures the gate leakage current of each transistor under measurement 372 in the step S510 of FIGS. 5 and 6. Prior to the start of the measurement of the gate leakage current of each transistor under measurement 372, the measurement control section 146 applies an electrical stress to the transistor under measurement 372 of each cell 310.

For the stress application, the measurement control section 146 turns on the first switches 374 and turns off the second switches 376. The measurement control section 146 then controls the stress applying section 394 of each cell 310 to apply a stress to the transistor under measurement 372 in the cell 310. Here, the measurement control section 146 may cause the stress applying section 394 to apply the stresses (1) to (4) mentioned in relation to FIG. 10 independently or sequentially to the transistor under measurement 372. The measurement control section 146 controls the stress applying section 394 in each cell 310 to apply the stress to the transistor under measurement 372 in the cell 310 substantially concurrently.

After performing the above operations, the measurement control section 146 sequentially selects each transistor under measurement 372, and measures the gate leakage current of the selected transistor under measurement 372. The selecting process of the transistors under measurement 372 is the same as the selecting process described with reference to FIGS. 8 and 9, and is therefore not explained here. In the following description of the present example, the series of operations to measure the gate leakage current of a single transistor under measurement 372 is explained.

To start with, the measurement control section 146 turns off the first switches 374, and turns on the second switches 376. The measurement control section 146 applies the gate voltage of substantially 0 V to the gate terminal of the transistor under measurement 372 (step S416). At this stage, the gate leakage current is not generated in the transistor under measurement 372.

After this, the measurement control section 146 sets the voltage of the capacitor 388 at a predetermined initial voltage value. Specifically speaking, the measurement control section 146 controls the reset transistor 380 to set the voltage of the capacitor 388 at the initial voltage $V_{R1}$. This is achieved by supplying the reset signal $\phi_{RES}$ that turns on the reset transistors 378 and 380.

After this, the characteristics measuring section 16 reads the variation in the voltage value of the capacitor 388 over a predetermined time period starting from when the voltage value of the capacitor 388 is set to the initial voltage value (step S418). Here, the measurement control section 146 causes the column selecting section 302 and the row selecting section 304 to select the cell 310. The characteristics measuring section 16 receives the voltage output from the output section 320 as the voltage of the capacitor 388.

Subsequently, the characteristics measuring section 16 calculates the current value of the background current of the cell 310 (a first current value) with reference to the variation in the voltage output from the output section 320 over the above-mentioned predetermined time period (step S420). Here, since the gate leakage current is not generated in the transistor under measurement 372, the capacitor 388 is charged and discharged by the background current. For this reason, the characteristics measuring section 16 can measure the background current based on the variation in the voltage of the capacitor 388 over the predetermined time period.

Following this, the measurement control section 146 applies a positive or negative gate voltage to the gate terminal of the transistor under measurement 372 (step S422). Here, the measurement control section 146 controls the voltages $V_{RN}$ and $V_{RP}$, to maintain the voltage applied between the gate and the source or between the gate and the drain of the transistor under measurement 372 at a substantially constant level. In this way, the gate leakage current is generated in the transistor under measurement 372 in accordance with the gate voltage.

After this, the measurement control section 146 sets the voltage value of the capacitor 388 to the predetermined initial voltage value. The characteristics measuring section 16 then reads the variation in the voltage value of the capacitor 388 over the above-mentioned predetermined time period starting from when the voltage value of the capacitor 388 is set to the initial voltage value (step S424).

Subsequently, the characteristics measuring section 16 calculates a second current value indicating the sum of the background current and the gate leakage current with reference to the variation in the voltage value of the capacitor 388 over the predetermined time period (step S426). In this case, the capacitor 388 is charged and discharged by the current corresponding to the sum of the background current and the gate leakage current. Therefore, the characteristics measuring section 16 can measure the current corresponding to the sum of the background current and the gate leakage current with reference to the variation in the voltage of the capacitor 388 over the predetermined time period.

After this, the characteristics measuring section 16 calculates the current value indicating the gate leakage current by subtracting the first current value from the second current value (step S428).

In the above-described manner, the output measuring section 148 can measure, as the electrical characteristic of each transistor under measurement 372, the voltage of the capacitor 388 through the output transistor 390 and the row selecting transistor 392. Which is to say, by performing the above series of controls, the output measuring section 148 can eliminate the influence of the background current and thus accurately measure the gate leakage current of the transistor under measurement 372. Also, the output measuring section 148 can measure even a small gate leakage current since the measurement is based on the integration of the gate leakage current.

Figure 13:
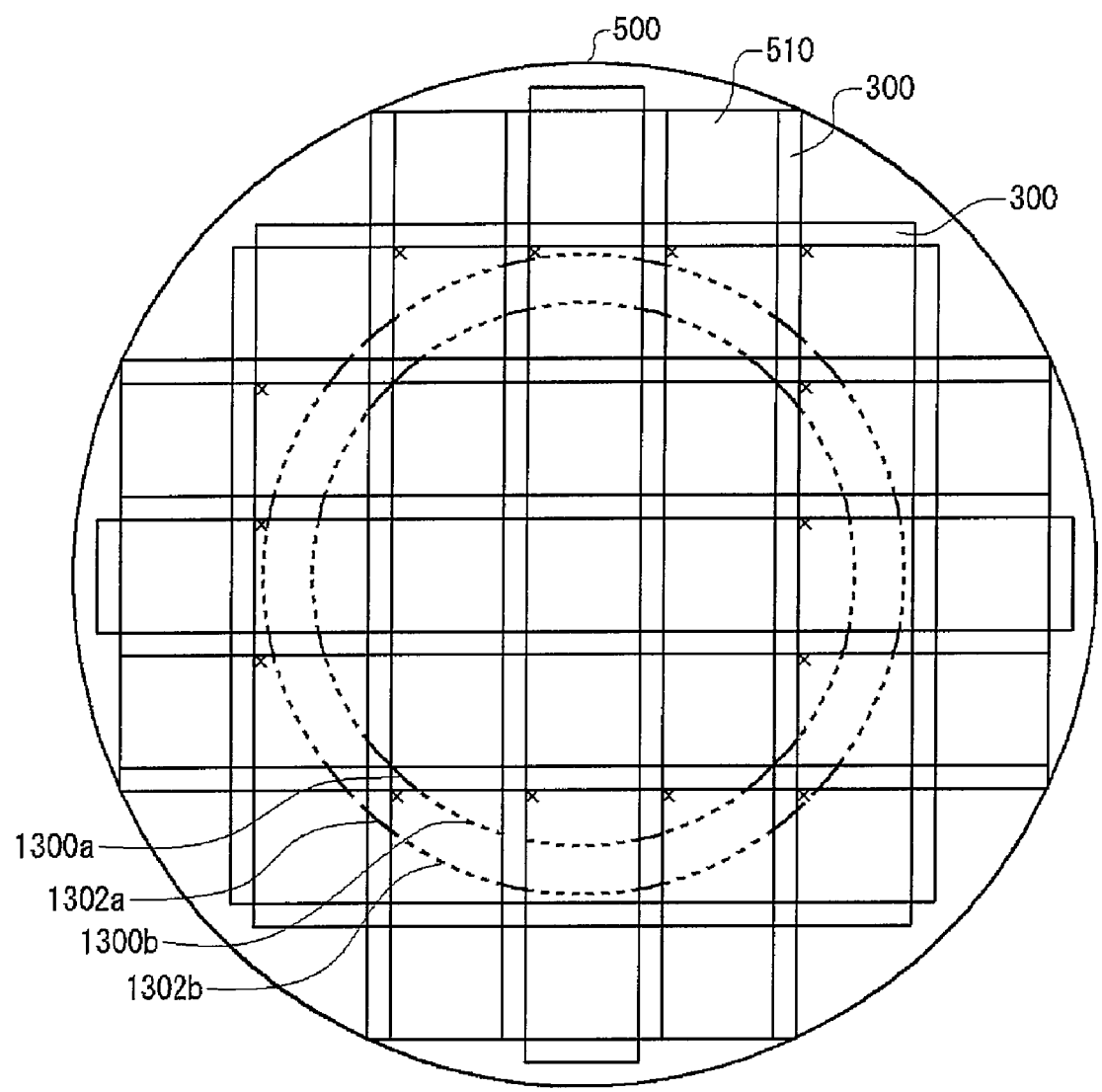
FIG. 13 illustrates a first example of the distribution of transistors under measurement which do not meet a standard.

FIG. 13 illustrates a first example of the distribution of the transistors under measurement which do not meet the standard. According to the present first example, two or more transistors under measurement 314 and/or transistors under measurement 372 whose electrical characteristics do not meet the predetermined standard are positioned on the wafer 500 so as to form a circle. When judging, during the line management, that the transistors under measurement 314 and/or 372 which do not meet the standard are positioned on the wafer 500 so as to form a circle, the identifying section 150 may conclude that the defects are generated in one or more manufacturing stages in which the wafer is rotated. According to the example shown in FIG. 13, the transistors under measurement 372 which do not meet the standard are positioned so as to form two circles of a circular region 1300 and a circular region 1302. Therefore, the identifying section 150 concludes that the defects are generated in the manufacturing stages in which the wafer is rotated. Such manufacturing stages include, for example, the thermal oxidization and annealing stages in which the wafer is heated while rotated, the CVD and spin coating stages in which thin films are formed on the wafer while the wafer is rotated, and the CMP stage in which the wafer is polished while rotated.

When judging, during the yield management, that the transistors under measurement which do not meet the standard are positioned on the wafer 500 so as to form a circle, the identifying section 150 may identify, as defective devices, electronic devices 510 which at least partially overlap the circles formed by the transistors under measurement 314 and/or 372 which do not meet the standard (in FIG. 13, the electronic devices 510 marked at the upper right corner with x).

When the electronic devices 510 and the test circuits 300 are formed on the wafer 500, the identifying section 150 can judge whether the transistors under measurement included in the test circuits 300 meet the standard, but can not judge whether the transistors included in the electronic devices 510 meet the standard. Therefore, the identifying section 150 may calculate a circular region 1300b and a circular region 1302b (represented by the dotted lines in FIG. 13) in which transistors may not meet the standard if formed, with reference to a circular region 1300a and a circular region 1302a (represented by the solid lines in FIG. 13). The circular regions 1300a and 1302a represent the distribution of the transistors under measurement which are included in the test circuits 300 and do not meet the standard. Since each test circuit 300 has transistors under measurement arranged in a two-dimensional matrix, it is possible to interpolate the circular regions 1300b and 1302b from the circular regions 1300a and 1302a.

The identifying section 150 may identify the manufacturing stages in which the defects are generated or the defective devices, with reference to the distribution of the transistors under measurement whose electrical characteristics fall within a predetermined range, which are selected from among the transistors under measurement which do not meet the standard. For example, the identifying section 150 may identify the manufacturing stages in which the defects are generated or the defective devices, with reference to the distribution, on the wafer, of the transistors under measurement whose threshold voltages (measured by the measuring section 145) exceed a predetermined reference upper limit value or falls below a reference lower limit value.

Here, the threshold voltage decreases, when the temperature during the thermal processing is higher than a target value, when the NMOS transistor experiences plasma damage higher than a reference value, or when the amount of the exposure of the gate terminal is larger than a target value and the gate length is smaller than a target value during the lithography stage, for example. On the other hand, the threshold voltage increases, when the PMOS transistor experiences plasma damage higher than the reference value, for example. For the reasons stated above, when the transistors under measurement whose threshold voltages fall below the reference lower limit value are positioned so as to form a circle, for example, the identifying section 150 may conclude that the defects are generated in the thermal processing stage, which may lower the threshold voltages if defects occur, from among the thermal processing, CVD, spin coating, CMP and other stages in which the wafer is rotated.

The identifying section 150 may refer to, as the predetermined standard, the range of the electrical characteristics of acceptable transistors under measurement. Alternatively, the identifying section 150 may refer to, as the predetermined standard, the electrical characteristics value which deviates from the average value among the electrical characteristics of the transistors under measurement by a value equal to or higher than a predetermined deviation. The deviation may be determined in accordance with permissible unevenness of the electrical characteristics of the transistors under measurement from the viewpoint of the target quality of the manufacturing line 100.

Figure 14:
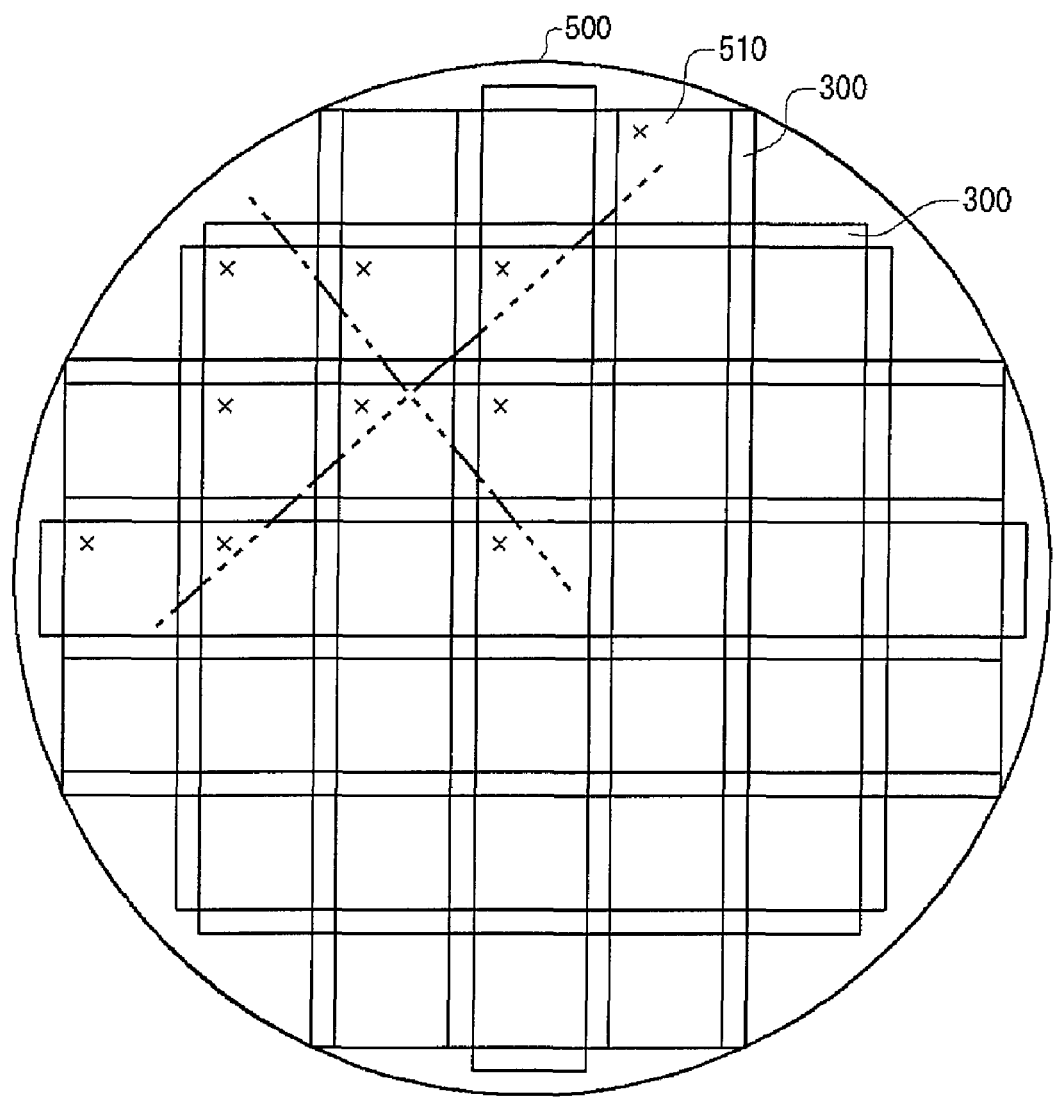
FIG. 14 illustrates a second example of the distribution of transistors under measurement which do not meet a standard.

FIG. 14 illustrates a second example of the distribution of the transistors under measurement which do not meet the standard. According to the second example, two or more transistors under measurement whose electrical characteristics do not meet the predetermined standard are positioned on the wafer 500 so as to form a cross. When judging that the transistors under measurement which do not meet the standard are positioned on the wafer 500 so as to form a cross, the identifying section 150 may conclude that the defects are generated by plasma damage in the manufacturing stages which use the plasma generated by means of a magnetic field. When judging, during the yield management, that the transistors under measurement which do not meet the standard are positioned on the wafer 500 so as to form a cross, the identifying section 150 may identify, as defective devices, electronic devices 510 which at least partially overlap the cross.

Here, the technique to interpolate the region in which transistors under measurement may not meet the standard if formed, the technique to identify the manufacturing stages in which the defects are generated or the defective devices based on the distribution of the transistors under measurement whose electrical characteristics do not meet the predetermined standard and fall within a predetermined range, and other related techniques are the same as described with reference to FIG. 13, and therefore not explained here.

Figure 15:
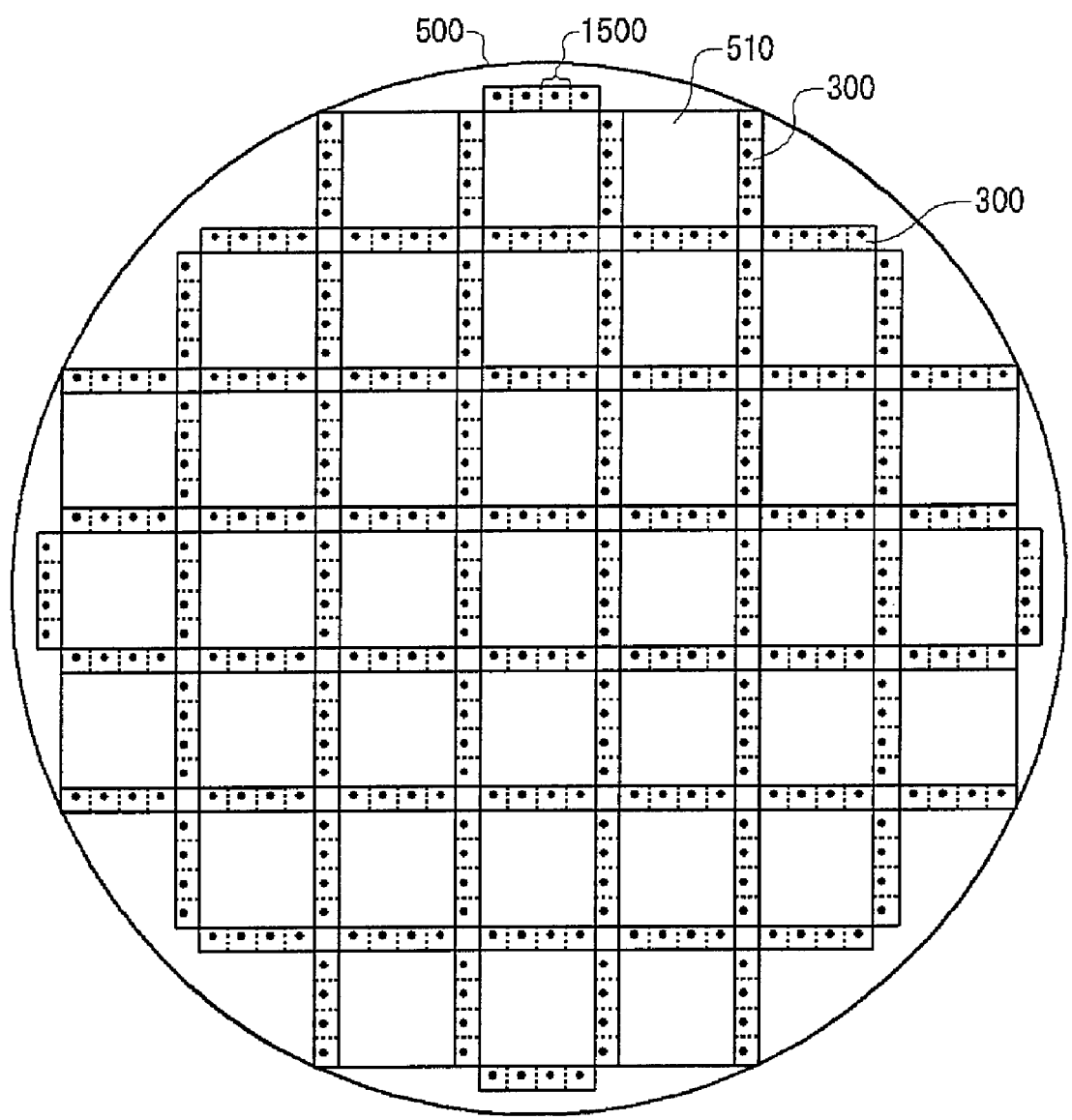
FIG. 15 illustrates a third example of the distribution of transistors under measurement which do not meet a standard.

FIG. 15 illustrates a third example of the distribution of the transistors under measurement which do not meet the standard. According to the third example, each of the two or more transistors under measurement whose electrical characteristics do not meet the predetermined standard is positioned, on the wafer 500, at the same position within an exposed region 1500. When judging that each of the transistors under measurement which do not meet the standard is positioned at the same position within the exposed region 1500, the identifying section 150 may conclude that the defects are generated in the manufacturing stages in which the exposure apparatus is used. In the case of the yield management, the identifying section 150 may identify, as defective devices, electronic devices 510 which contain a region exposed to light by using the corresponding exposure pattern.

Here, the technique to interpolate the region in which transistors under measurement may not meet the standard if formed, and the technique to identify the manufacturing stages in which the defects are generated or the defective devices based on the distribution of the transistors under measurement whose electrical characteristics do not meet the predetermined standard and fall within a predetermined range are the same as described with reference to FIG. 13, and therefore not explained here.

Figure 16:
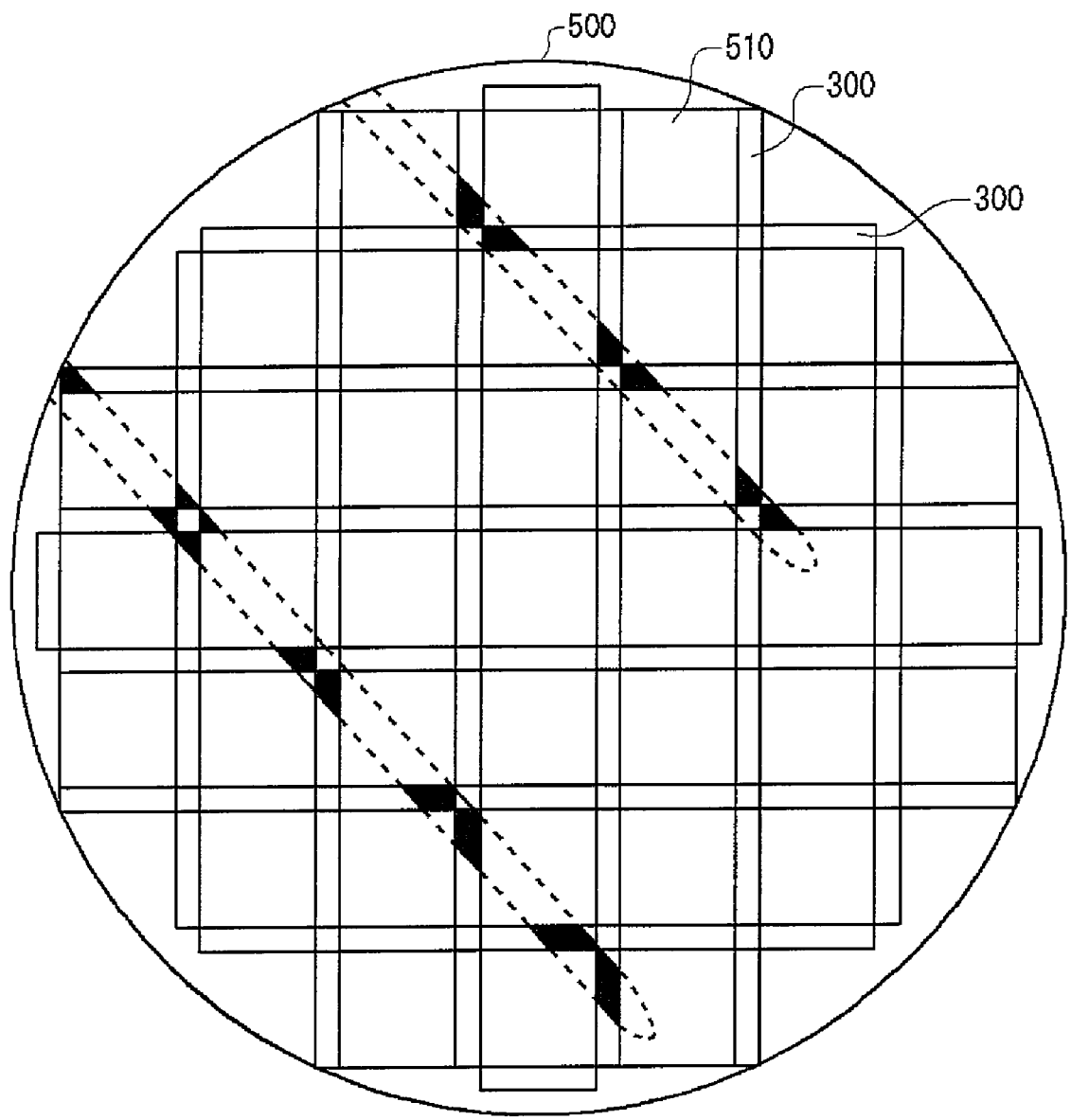
FIG. 16 illustrates a fourth example of the distribution of transistors under measurement which do not meet a standard.

FIG. 16 illustrates a fourth example of the distribution of the transistors under measurement which do not meet the standard. According to the fourth example, two or more transistors under measurement whose electrical characteristics do not meet the predetermined standard are positioned on the wafer 500 so as to form a ribbon. When judging that the transistors under measurement which do not meet the standard are positioned on the wafer 500 so as to form a ribbon, the identifying section 150 may conclude that the defects are generated in the manufacturing stages in which the wet processing is performed since the chemical solution remains on the wafer 500. Such manufacturing stages include, for example, the wet cleaning stage and the etching stage.

Here, the technique to interpolate the region in which transistors under measurement may not meet the standard if formed, and the technique to identify the manufacturing stages in which the defects are generated and the defective devices based on the distribution of the transistors under measurement whose electrical characteristics do not meet the predetermined standard and fall within a predetermined range are the same as described with reference to FIG. 13, and therefore not explained here.

Additionally, when judging that each of the transistors under measurement whose electrical characteristics do not meet the predetermined standard is positioned, on the wafer 500, in a region in which the ratio of the polished patterning area is higher than an upper limit value or lower than a lower limit value, the identifying section 150 may conclude that the defects are generated in the manufacturing stages in which the CMP is performed. When the ratio of the polished patterning area is high, the polishing process tends to be done less than necessary. Therefore, unnecessary patterns are highly likely to be left behind. When the ratio of the polished patterning area is low, the polishing process tends to be done more than necessary. Therefore, necessary patterns are highly likely to be also polished away.

The manufacturing system 10 having the above-described configurations can identify the manufacturing stages in which the defects are generated or the defective devices, with reference to the distribution, on the wafer, of the transistors under measurement whose electrical characteristics do not meet the standard. Additionally, the manufacturing system 10 can narrow down the manufacturing stages in which the defects are generated, with reference to the distribution on the wafer of the transistors under measurement whose electrical characteristics fall within the predetermined range.

Figure 17:
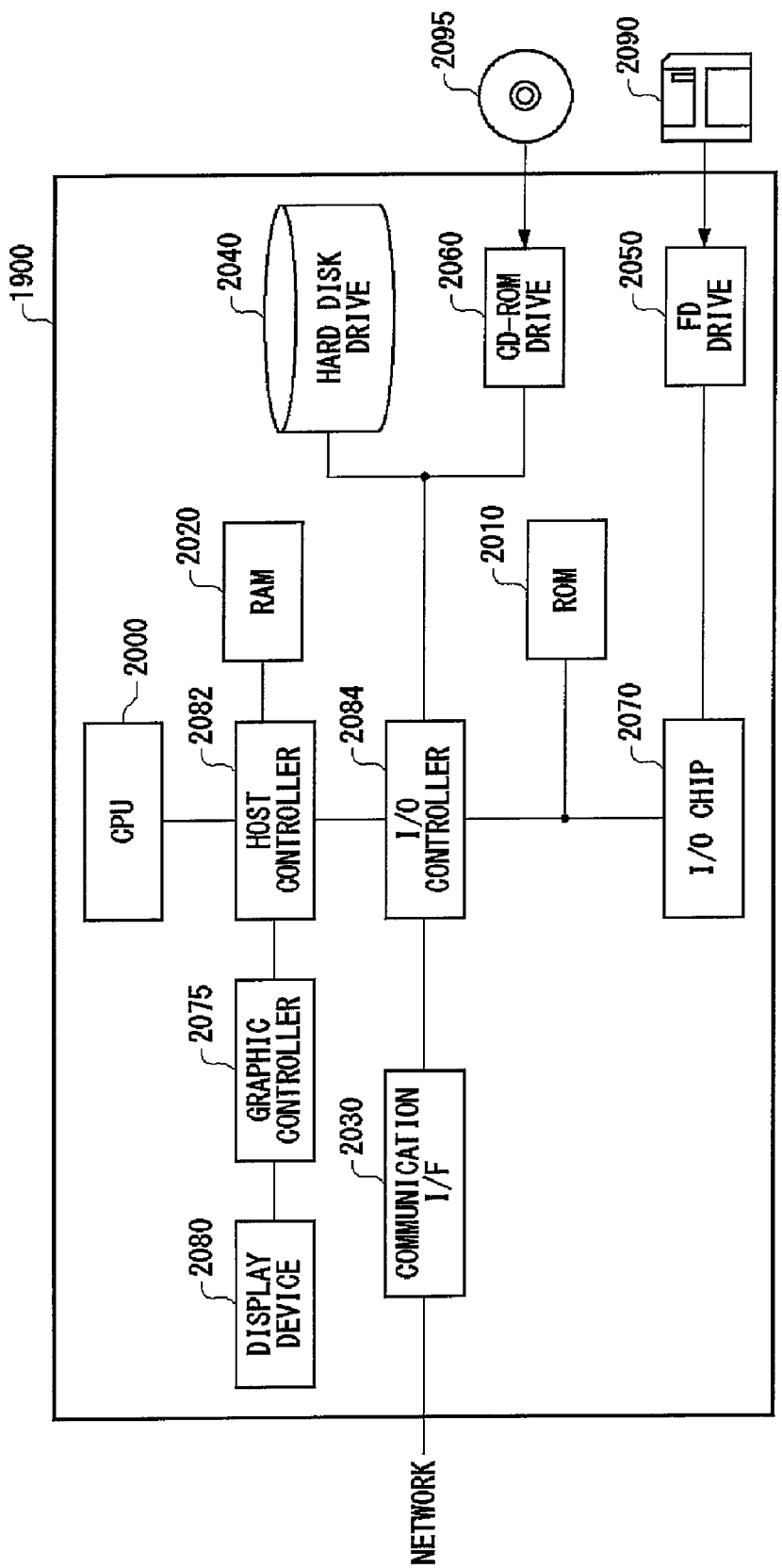
FIG. 17 illustrates an exemplary hardware configuration of a computer 1900 relating to an embodiment of the present invention.

FIG. 17 illustrates an exemplary hardware configuration of a computer 1900 relating to an embodiment of the present invention. The computer 1900 relating to the present embodiment is constituted by a CPU surrounding section, an input/output (I/O) section and a legacy I/O section. The CPU surrounding section includes a CPU 2000, a RAM 2020, a graphic controller 2075 and a display device 2080 which are connected to each other by means of a host controller 2082. The I/O section includes a communication interface 2030, a hard disk drive 2040, and a CD-ROM drive 2060 which are connected to the host controller 2082 by means of an I/O controller 2084. The legacy I/O section includes a ROM 2010, a flexible disk drive 2050, and an I/O chip 2070 which are connected to the I/O controller 2084.

The host controller 2082 connects the RAM 2020 with the CPU 2000 and graphic controller 2075 which access the RAM 2020 at a high transfer rate. The CPU 2000 operates in accordance with programs stored on the ROM 2010 and RAM 2020, to control the constituents. The graphic controller 2075 obtains image data which is generated by the CPU 2000 or the like on a frame buffer provided within the RAM 2020, and causes the display device 2080 to display the obtained image data. Alternatively, the graphic controller 2075 may include therein a frame buffer for storing thereon the image data generated by the CPU 2000 or the like.

The I/O controller 2084 connects, to the host controller 2082, the hard disk drive 2040, communication interface 2030 and CD-ROM drive 2060 which are I/O devices operating at a relatively high rate. The communication interface 2030 communicates with external apparatuses via the network. Here, the communication interface 2030 may communicate, via the network, one or more manufacturing apparatuses 105 in the manufacturing line 100, the measuring section 145, the selecting section 165 and/or the discarding section 170. The hard disk drive 2040 stores thereon programs and data to be used by the CPU 2000 in the computer 1900. The CD-ROM drive 2060 reads programs or data from a CD-ROM 2095, and supplies the read programs or data to the hard disk drive 2040 via the RAM 2020.

The I/O controller 2084 is also connected to the ROM 2010, flexible disk drive 2050 and I/O chip 2070 which are I/O devices operating at a relatively low rate. The ROM 2010 stores thereon a boot program executed by the computer 1900 at the startup, programs dependent on the hardware of the computer 1900, and the like. The flexible disk drive 2050 reads programs or data from a flexible disk 2090, and supplies the read programs or data to the hard disk drive 2040 via the RAM 2020. The I/O chip 2070 is connected to the flexible disk drive 2050, and used to connect a variety of I/O devices to the computer 1900, via a parallel port, a serial port, a keyboard port, a mouse port or the like.

The programs to be provided to the hard disk drive 2040 via the RAM 2020 are provided by a user in the state of being stored on a recording medium such as the flexible disk 2090, the CD-ROM 2095, and an IC card. The programs are read from the recording medium, and the read programs are installed in the hard disk drive 2040 in the computer 1900 via the RAM 2020, to be executed by the CPU 2000.

The programs that are installed in the computer 1900 and cause the computer 1900 to function as the management apparatus 142 include a manufacturing control module, an identifying module, and a condition changing module including therein a setting changing module. The programs or modules request the CPU 2000 and the like to cause the computer 1900 to function as the manufacturing control section 140, the identifying section 150 and the condition changing section 155 including therein the setting changing section 160.

The programs or modules mentioned above may be stored on an external recording medium. Such a recording medium is, for example, an optical recording medium such as DVD and CD, a magnet-optical recording medium such as MO, a tape medium, a semiconductor memory such as an IC card and the like, in addition to the flexible disk 2090 and CD-ROM 2095. Alternatively, the recording medium may be a storage device such as a hard disk or RAM which is provided in a server system connected to a dedicated communication network or the Internet, and the programs may be provided to the computer 1900 via the network.

An embodiment of the present invention can efficiently manage the quality of the manufacturing line or the yield of the electronic devices manufactured by the manufacturing line, thereby improving the manufacturing efficiency of the electronic devices.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alternations or improvements can be included in the technical scope of the invention.

What is claimed is:

1. A management method of managing a quality of a manufacturing line that is designed for manufacturing an electronic device through a plurality of manufacturing stages, the management method comprising:
   a manufacturing step of manufacturing, through the manufacturing line, a wafer that has therein a test circuit including a plurality of transistors under measurement;
   a measuring step of measuring an electrical characteristic of each of the plurality of transistors under measurement; and
   an identifying step of identifying, among the plurality of manufacturing stages, a manufacturing stage in which a defect is generated, with reference to a distribution, on the wafer, of one or more transistors under measurement whose electrical characteristics do not meet a predetermined standard.

2. The management method as set forth in claim 1, wherein the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, and
   the measuring step comprises:
      a transistor selecting step of sequentially selecting each of the plurality of circuits under measurement by using the selecting section; and
      an output measuring step of measuring the electrical characteristic of the transistor under measurement included in the selected circuit under measurement, based on the output signal output onto the output signal line from the selected circuit under measurement.

3. The management method as set forth in claim 1, wherein the manufacturing step comprises:
   a device formation step of forming a plurality of electronic devices on the wafer in a lattice pattern; and
   a test circuit formation step of forming a plurality of test circuits on the wafer in a plurality of regions between the plurality of electronic devices, and
   the identifying step includes identifying, among the plurality of manufacturing stages, a manufacturing stage in which a defect is generated, with reference to a distribution, on the wafer, of one or more transistors under measurement which are included in the plurality of test circuits and whose electrical characteristics do not meet a predetermined standard.

4. The management method as set forth in claim 1, wherein the identifying step includes concluding that a defect is generated in a manufacturing stage in which the wafer is rotated, when two or more transistors under measurement whose electrical characteristics do not meet the predetermined standard are judged to be positioned on the wafer so as to form a circle.

5. The management method as set forth in claim 1, wherein the identifying step includes concluding that a defect is generated in a manufacturing stage in which a plasma is used, when two or more transistors under measurement whose electrical characteristics do not meet the predetermined standard are judged to be positioned on the wafer so as to form a cross.

6. The management method as set forth in claim 1, wherein the identifying step includes concluding that a defect is generated in a manufacturing stage in which an exposure apparatus is used, when each of two or more transistors under measurement whose electrical characteristics do not meet the predetermined standard is judged to be positioned, on the wafer, at a same position within an exposure region.

7. The management method as set forth in claim 1, wherein the identifying step includes concluding that a defect is generated in a manufacturing stage in which wet processing is performed, when two or more transistors under measurement whose electrical characteristics do not meet the predetermined standard are judged to be positioned on the wafer so as to form a ribbon.

8. The management method as set forth in claim 1, wherein the identifying step includes concluding that a defect is generated in a manufacturing stage in which chemical and mechanical polishing (CMP) is performed, when each of two or more transistors under measurement whose electrical characteristics do not meet the predetermined standard is judged to be positioned, on the wafer, in a region in which a ratio of a polished patterning area is higher than an upper limit value or lower than a lower limit value.

9. The management method as set forth in claim 1, wherein the measuring step includes measuring, as the electrical characteristic of each of the plurality of transistors under measurement, a threshold voltage of the transistor under measurement, and
   the identifying step includes identifying, among the plurality of manufacturing stages, the manufacturing stage in which the defect is generated, with reference to a distribution, on the wafer, of one or more transistors under measurement whose threshold voltages (i) exceed a predetermined reference upper limit value or (ii) fall below a predetermined reference lower limit value.

10. A manufacturing method of manufacturing the electronic device through the manufacturing line whose quality is managed by the management method as set forth in claim 1.

11. A management method of managing a quality of a manufacturing line that is designed for manufacturing an electronic device through a plurality of manufacturing stages, the management method comprising:

a manufacturing step of manufacturing, through the manufacturing line, a wafer that has therein a test circuit including a plurality of transistors under measurement;

a measuring step of measuring an electrical characteristic of each of the plurality of transistors under measurement; and an identifying step of identifying, among the plurality of manufacturing stages, a manufacturing stage in which a defect is generated, with reference to a distribution, on the wafer, of one or more transistors under measurement whose electrical characteristics do not meet a predetermined standard, wherein the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the measuring step comprises:

a transistor selecting step of sequentially selecting each of the plurality of circuits under measurement by using the selecting section; and an output measuring step of measuring the electrical characteristic of the transistor under measurement included in the selected circuit under measurement, based on the output signal output onto the output signal line from the selected circuit under measurement, each of the plurality of circuits under measurement includes:

a gate voltage control section that applies a designated gate voltage to a gate terminal of a corresponding one of the plurality of transistors under measurement;

a reference voltage input section that supplies a reference voltage input thereto from outside to a reference voltage terminal of the corresponding transistor under measurement, the reference voltage terminal being one of a drain terminal and a source terminal of the corresponding transistor under measurement; and a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal, the selecting section includes:

a row selecting section that outputs a selection signal to one or more circuits under measurement which correspond to a designated row, from among the plurality of circuits under measurement that are arranged in the two-dimensional matrix; and a column selecting section that selects a circuit under measurement corresponding to a designated column, from among the one or more circuits under measurement to which the row selecting section has input the selection signal, and causes the output signal line to output a terminal voltage of the selected circuit under measurement, the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and the output measuring step includes measuring the terminal voltage, as the electrical characteristic of the selected transistor under measurement.

12. The management method as set forth in claim 11, wherein the measuring step includes measuring, as the electrical characteristic of each of the plurality of transistors under measurement, a threshold voltage of the transistor under measurement, based on the reference voltage and the terminal voltage of the transistor under measurement.

13. A management method of managing a quality of a manufacturing line that is designed for manufacturing an electronic device through a plurality of manufacturing stages, the management method comprising:

a manufacturing step of manufacturing, through the manufacturing line, a wafer that has therein a test circuit including a plurality of transistors under measurement;

a measuring step of measuring an electrical characteristic of each of the plurality of transistors under measurement; and an identifying step of identifying, among the plurality of manufacturing stages, a manufacturing stage in which a defect is generated, with reference to a distribution, on the wafer, of one or more transistors under measurement whose electrical characteristics do not meet a predetermined standard, wherein the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the measuring step comprises:

a transistor selecting step of sequentially selecting each of the plurality of circuits under measurement by using the selecting section; and an output measuring step of measuring the electrical characteristic of the transistor under measurement included in the selected circuit under measurement, based on the output signal output onto the output signal line from the selected circuit under measurement, each of the plurality of circuits under measurement includes:

a gate voltage control section that applies a designated gate voltage to a gate terminal of a corresponding one of the plurality of transistors under measurement;

a voltage applying section that applies a voltage to a source terminal and a drain terminal of the corresponding transistor under measurement, and controls a voltage applied to a gate insulation film of the corresponding transistor under measurement so as to remain at a substantially constant level;
a capacitor that accumulates a gate leakage current flowing from the gate terminal to the source and drain terminals in the corresponding transistor under measurement; and
a capacitor voltage output section that, on condition that a selection signal is input from outside, outputs a capacitor voltage at an end of the capacitor which is closer to the source and drain terminals, as the output signal, and
the output measuring step includes measuring the capacitor voltage, as the electrical characteristic of the selected transistor under measurement.

14. A management apparatus for managing a quality of a manufacturing line that is designed for manufacturing an electronic device through a plurality of manufacturing stages, the management apparatus comprising:
a manufacturing control section that causes the manufacturing line to manufacture a wafer that has therein a test circuit including a plurality of transistors under measurement; and
an identifying section that receives a measured electrical characteristic of each of the plurality of transistors under measurement, and identifies, among the plurality of manufacturing stages, a manufacturing stage in which a defect is generated, with reference to a distribution, on the wafer, of one or more transistors under measurement whose electrical characteristics do not meet a predetermined standard.

15. The management apparatus as set forth in claim 14, wherein
the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement,
the management apparatus further comprises a measuring section that measures an electrical characteristic of each of the plurality of transistors under measurement included in the test circuit; the measuring section including:
a transistor selecting section of sequentially selecting each of the plurality of circuits under measurement by using the selecting section; and
an output measuring section of measuring the electrical characteristic of the transistor under measurement included in the selected circuit under measurement, based on the output signal output onto the output signal line from the selected circuit under measurement,
each of the plurality of circuits under measurement includes:
a gate voltage control section that applies a designated gate voltage to a gate terminal of a corresponding one of the plurality of transistors under measurement;
a reference voltage input section that supplies a reference voltage input thereto from outside to a reference voltage terminal of the corresponding transistor under measurement, the reference voltage terminal being one of a drain terminal and a source terminal of the corresponding transistor under measurement; and
a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal,
the selecting section includes:
a row selecting section that outputs a selection signal to one or more circuits under measurement which correspond to a designated row, from among the plurality of circuits under measurement that are arranged in the two-dimensional matrix; and
a column selecting section that selects a circuit under measurement corresponding to a designated column, from among the one or more circuits under measurement to which the row selecting section has input the selection signal, and causes the output signal line to output a terminal voltage of the selected circuit under measurement,
the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and
the output measuring section includes measuring the terminal voltage, as the electrical characteristic of the selected transistor under measurement.

16. The management apparatus as set forth in claim 15, wherein
the measuring section measures, as the electrical characteristic of each of the plurality of transistors under measurement, a threshold voltage of the transistor under measurement, based on the reference voltage and the terminal voltage of the transistor under measurement.

17. The management apparatus as set forth in claim 14, wherein
the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement,
the management apparatus further comprises a measuring section that measures an electrical characteristic of each of the plurality of transistors under measurement included in the test circuit; the measuring section including:
a transistor selecting section of sequentially selecting each of the plurality of circuits under measurement by using the selecting section; and
an output measuring section of measuring the electrical characteristic of the transistor under measurement included in the selected circuit under measurement, based on the output signal output onto the output signal line from the selected circuit under measurement, each of the plurality of circuits under measurement includes:
  a gate voltage control section that applies a designated gate voltage to a gate terminal of a corresponding one of the plurality of transistors under measurement;
  a voltage applying section that applies a voltage to a source terminal and a drain terminal of the corresponding transistor under measurement, and controls a voltage applied to a gate insulation film of the corresponding transistor under measurement so as to remain at a substantially constant level;
  a capacitor that accumulates a gate leakage current flowing from the gate terminal to the source and drain terminals in the corresponding transistor under measurement; and
  a capacitor voltage output section that, on condition that a selection signal is input from outside, outputs a capacitor voltage at an end of the capacitor which is closer to the source and drain terminals, as the output signal, and
the output measuring section includes measuring the capacitor voltage, as the electrical characteristic of the selected transistor under measurement.

18. A manufacturing method of manufacturing an electronic device through a manufacturing line that has a plurality of manufacturing apparatuses performing processes corresponding to a plurality of manufacturing stages, the manufacturing method comprising:
  a manufacturing step of manufacturing, through the manufacturing line, a wafer that has therein a test circuit including a plurality of transistors under measurement;
  a measuring step of measuring an electrical characteristic of each of the plurality of transistors under measurement included in the test circuit;
  an identifying step of identifying, among the plurality of manufacturing stages, a manufacturing stage in which a defect is generated, with reference to a distribution, on the wafer, of one or more transistors under measurement whose electrical characteristics do not meet a predetermined standard; and
  a condition changing step of changing a processing condition related to a manufacturing apparatus performing a process corresponding to the manufacturing stage in which the defect is generated, wherein
the manufacturing step includes, when a processing condition related to at least one of the plurality of manufacturing apparatuses is changed, manufacturing the electronic device through the manufacturing line with the changed processing condition.

19. The manufacturing method as set forth in claim 18, wherein
the manufacturing step includes manufacturing, through the manufacturing line, alternately (i) at least one product wafer having therein the electronic device and (ii) a test wafer having therein the test circuit, and
the manufacturing method further comprises a discarding step of, on condition that the manufacturing stage in which the defect is generated is identified, discarding at least one product wafer which is manufactured from when a preceding test wafer is manufactured to when the processing condition is changed.

20. The manufacturing method as set forth in claim 18, wherein
the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement,
the measuring step comprises:
  a transistor selecting step of sequentially selecting each of the plurality of circuits under measurement by using the selecting section; and
  an output measuring step of measuring the electrical characteristic of the transistor under measurement included in the selected circuit under measurement, based on the output signal output onto the output signal line from the selected circuit under measurement,
each of the plurality of circuits under measurement includes:
  a gate voltage control section that applies a designated gate voltage to a gate terminal of a corresponding one of the plurality of transistors under measurement;
  a reference voltage input section that supplies a reference voltage input thereto from outside to a reference voltage terminal of the corresponding transistor under measurement, the reference voltage terminal being one of a drain terminal and a source terminal of the corresponding transistor under measurement; and
  a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal,
the selecting section includes:
  a row selecting section that outputs a selection signal to one or more circuits under measurement which correspond to a designated row, from among the plurality of circuits under measurement that are arranged in the two-dimensional matrix; and
  a column selecting section that selects a circuit under measurement corresponding to a designated column, from among the one or more circuits under measurement to which the row selecting section has input the selection signal, and causes the output signal line to output a terminal voltage of the selected circuit under measurement,
the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and
the output measuring step includes measuring the terminal voltage, as the electrical characteristic of the selected transistor under measurement.

21. The manufacturing method as set forth in claim 20, wherein
the measuring step includes measuring, as the electrical characteristic of each of the plurality of transistors under measurement, a threshold voltage of the transistor under measurement, based on the reference voltage and the terminal voltage of the transistor under measurement.

22. The manufacturing method as set forth in claim 18, wherein the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the measuring step comprises:
- a transistor selecting step of sequentially selecting each of the plurality of circuits under measurement by using the selecting section; and
- an output measuring step of measuring the electrical characteristic of the transistor under measurement included in the selected circuit under measurement, based on the output signal output onto the output signal line from the selected circuit under measurement, each of the plurality of circuits under measurement includes:
- a gate voltage control section that applies a designated gate voltage to a gate terminal of a corresponding one of the plurality of transistors under measurement;
- a voltage applying section that applies a voltage to a source terminal and a drain terminal of the corresponding transistor under measurement, and controls a voltage applied to a gate insulation film of the corresponding transistor under measurement so as to remain at a substantially constant level;
- a capacitor that accumulates a gate leakage current flowing from the gate terminal to the source and drain terminals in the corresponding transistor under measurement; and
- a capacitor voltage output section that, on condition that a selection signal is input from outside, outputs a capacitor voltage at an end of the capacitor which is closer to the source and drain terminals, as the output signal, and the output measuring step includes measuring the capacitor voltage, as the electrical characteristic of the selected transistor under measurement.

23. A manufacturing method of manufacturing an electronic device, comprising:
- a manufacturing step of manufacturing a wafer having therein a plurality of test circuits and a plurality of electronic devices, each of the plurality of test circuits including a plurality of transistors under measurement;
- a measuring step of measuring an electrical characteristic of each of the plurality of transistors under measurement in each of the plurality of test circuits;
- an identifying step of identifying, among the plurality of electronic devices, a defective device which is likely to experience a defect, with reference to a distribution, on the wafer, of one or more transistors under measurement whose electrical characteristics do not meet a predetermined standard;
- a selecting step of selecting, from the plurality of electronic devices, one or more electronic devices other than the defective device; and
- a product output step of outputting, as one or more products, the one or more electronic devices selected in the selecting step.

24. The manufacturing method as set forth in claim 23, wherein the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the measuring step comprises:
- a transistor selecting step of sequentially selecting each of the plurality of circuits under measurement by using the selecting section; and
- an output measuring step of measuring the electrical characteristic of the transistor under measurement included in the selected circuit under measurement, based on the output signal output onto the output signal line from the selected circuit under measurement, each of the plurality of circuits under measurement includes:
- a gate voltage control section that applies a designated gate voltage to a gate terminal of a corresponding one of the plurality of transistors under measurement;
- a reference voltage input section that supplies a reference voltage input thereto from outside to a reference voltage terminal of the corresponding transistor under measurement, the reference voltage terminal being one of a drain terminal and a source terminal of the corresponding transistor under measurement; and
- a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal, the selecting section includes:
- a row selecting section that outputs a selection signal to one or more circuits under measurement which correspond to a designated row, from among the plurality of circuits under measurement that are arranged in the two-dimensional matrix; and
- a column selecting section that selects a circuit under measurement corresponding to a designated column, from among the one or more circuits under measurement to which the row selecting section has input the selection signal, and causes the output signal line to output a terminal voltage of the selected circuit under measurement, the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and the output measuring step includes measuring the terminal voltage, as the electrical characteristic of the selected transistor under measurement.

25. The manufacturing method as set forth in claim 24, wherein the measuring step includes measuring, as the electrical characteristic of each of the plurality of transistors under measurement, a threshold voltage of the transistor under measurement, based on the reference voltage and the terminal voltage of the transistor under measurement.

26. The manufacturing method as set forth in claim 23, wherein the manufacturing step includes manufacturing, through the manufacturing line, the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the measuring step comprises:
 a transistor selecting step of sequentially selecting each of the plurality of circuits under measurement by using the selecting section; and
 an output measuring step of measuring the electrical characteristic of the transistor under measurement included in the selected circuit under measurement, based on the output signal output onto the output signal line from the selected circuit under measurement, each of the plurality of circuits under measurement includes:
 a gate voltage control section that applies a designated gate voltage to a gate terminal of a corresponding one of the plurality of transistors under measurement;
 a voltage applying section that applies a voltage to a source terminal and a drain terminal of the corresponding transistor under measurement, and controls a voltage applied to a gate insulation film of the corresponding transistor under measurement so as to remain at a substantially constant level;
 a capacitor that accumulates a gate leakage current flowing from the gate terminal to the source and drain terminals in the corresponding transistor under measurement; and
 a capacitor voltage output section that, on condition that a selection signal is input from outside, outputs a capacitor voltage at an end of the capacitor which is closer to the source and drain terminals, as the output signal, and the output measuring step includes measuring the capacitor voltage, as the electrical characteristic of the selected transistor under measurement.

27. A manufacturing system for manufacturing an electronic device through a plurality of manufacturing stages, the manufacturing system comprising:
 a manufacturing line that includes a plurality of manufacturing apparatuses performing processes corresponding to the plurality of manufacturing stages, the manufacturing line manufacturing the electronic device;
 a manufacturing control section that causes the manufacturing line to manufacture a wafer that has therein a test circuit including a plurality of transistors under measurement;
 a measuring section that measures an electrical characteristic of each of the plurality of transistors under measurement included in the test circuit;
 an identifying section that identifies, among the plurality of manufacturing stages, a manufacturing stage in which a defect is generated, with reference to a distribution, on the wafer, of one or more transistors under measurement whose electrical characteristics do not meet a predetermined standard; and
 a setting changing section that changes a setting for a manufacturing apparatus performing a process corresponding to the manufacturing stage in which the defect is generated.

28. The manufacturing system as set forth in claim 27, wherein the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the manufacturing system further comprises a measuring section that measures an electrical characteristic of each of the plurality of transistors under measurement included in the test circuit; the measuring section including:
 a transistor selecting section of sequentially selecting each of the plurality of circuits under measurement by using the selecting section; and
 an output measuring section of measuring the electrical characteristic of the transistor under measurement included in the selected circuit under measurement, based on the output signal output onto the output signal line from the selected circuit under measurement, and each of the plurality of circuits under measurement includes:
 a gate voltage control section that applies a designated gate voltage to a gate terminal of a corresponding one of the plurality of transistors under measurement;
 a reference voltage input section that supplies a reference voltage input thereto from outside to a reference voltage terminal of the corresponding transistor under measurement, the reference voltage terminal being one of a drain terminal and a source terminal of the corresponding transistor under measurement; and
 a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal, the selecting section includes:
 a row selecting section that outputs a selection signal to one or more circuits under measurement which correspond to a designated row, from among the plurality of circuits under measurement that are arranged in the two-dimensional matrix; and
 a column selecting section that selects a circuit under measurement corresponding to a designated column, from among the one or more circuits under measurement to which the row selecting section has input the selection signal, and causes the output signal line to output a terminal voltage of the selected circuit under measurement, the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and the output measuring section includes measuring the terminal voltage, as the electrical characteristic of the selected transistor under measurement.

29. The manufacturing system as set forth in claim 28, wherein the measuring section measures, as the electrical characteristic of each of the plurality of transistors under measurement, a threshold voltage of the transistor under measurement, based on the reference voltage and the terminal voltage of the transistor under measurement.

30. The manufacturing system as set forth in claim 27, wherein the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the manufacturing system further comprises a measuring section that measures an electrical characteristic of each of the plurality of transistors under measurement included in the test circuit; the measuring section including:

a transistor selecting section of sequentially selecting each of the plurality of circuits under measurement by using the selecting section; and an output measuring section of measuring the electrical characteristic of the transistor under measurement included in the selected circuit under measurement, based on the output signal output onto the output signal line from the selected circuit under measurement, each of the plurality of circuits under measurement includes:

a gate voltage control section that applies a designated gate voltage to a gate terminal of a corresponding one of the plurality of transistors under measurement;

a voltage applying section that applies a voltage to a source terminal and a drain terminal of the corresponding transistor under measurement, and controls a voltage applied to a gate insulation film of the corresponding transistor under measurement so as to remain at a substantially constant level;

a capacitor that accumulates a gate leakage current flowing from the gate terminal to the source and drain terminals in the corresponding transistor under measurement; and a capacitor voltage output section that, on condition that a selection signal is input from outside, outputs a capacitor voltage at an end of the capacitor which is closer to the source and drain terminals, as the output signal, and the output measuring section includes measuring the capacitor voltage, as the electrical characteristic of the selected transistor under measurement.

31. A manufacturing system for manufacturing an electronic device, comprising:

a manufacturing line that manufactures a wafer having therein a plurality of test circuits and a plurality of electronic devices, each of the plurality of test circuits including a plurality of transistors under measurement;

a measuring section that measures an electrical characteristic of each of the plurality of transistors under measurement in each of the plurality of test circuits;

an identifying section that identifies, among the plurality of electronic devices, a defective device which is likely to experience a defect, with reference to a distribution, on the wafer, of one or more transistors under measurement whose electrical characteristics do not meet a predetermined standard;

a selecting section that selects, from the plurality of electronic devices, one or more electronic devices other than the defective device; and a product output section that outputs, as one or more products, the one or more electronic devices selected by the selecting section.

32. The manufacturing system as set forth in claim 31, wherein the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the manufacturing system further comprises a measuring section that measures an electrical characteristic of each of the plurality of transistors under measurement included in the test circuit; the measuring section including:

a transistor selecting section of sequentially selecting each of the plurality of circuits under measurement by using the selecting section; and an output measuring section of measuring the electrical characteristic of the transistor under measurement included in the selected circuit under measurement, based on the output signal output onto the output signal line from the selected circuit under measurement, each of the plurality of circuits under measurement includes:

a gate voltage control section that applies a designated gate voltage to a gate terminal of a corresponding one of the plurality of transistors under measurement;

a reference voltage input section that supplies a reference voltage input thereto from outside to a reference voltage terminal of the corresponding transistor under measurement, the reference voltage terminal being one of a drain terminal and a source terminal of the corresponding transistor under measurement; and a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal, the selecting section includes:
  a row selecting section that outputs a selection signal to one or more circuits under measurement which correspond to a designated row, from among the plurality of circuits under measurement that are arranged in the two-dimensional matrix; and
  a column selecting section that selects a circuit under measurement corresponding to a designated column, from among the one or more circuits under measurement to which the row selecting section has input the selection signal, and causes the output signal line to output a terminal voltage of the selected circuit under measurement, the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and the output measuring section includes measuring the terminal voltage, as the electrical characteristic of the selected transistor under measurement.

33. The manufacturing system as set forth in claim 32, wherein
the measuring section measures, as the electrical characteristic of each of the plurality of transistors under measurement, a threshold voltage of the transistor under measurement, based on the reference voltage and the terminal voltage of the transistor under measurement.

34. The manufacturing system as set forth in claim 31, wherein
the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the manufacturing system further comprises a measuring section that measures an electrical characteristic of each of the plurality of transistors under measurement included in the test circuit; the measuring section including:
  a transistor selecting section of sequentially selecting each of the plurality of circuits under measurement by using the selecting section; and
  an output measuring section of measuring the electrical characteristic of the transistor under measurement included in the selected circuit under measurement, based on the output signal output onto the output signal line from the selected circuit under measurement, each of the plurality of circuits under measurement includes:
  a gate voltage control section that applies a designated gate voltage to a gate terminal of a corresponding one of the plurality of transistors under measurement;
  a voltage applying section that applies a voltage to a source terminal and a drain terminal of the corresponding transistor under measurement, and controls a voltage applied to a gate insulation film of the corresponding transistor under measurement so as to remain at a substantially constant level;
  a capacitor that accumulates a gate leakage current flowing from the gate terminal to the source and drain terminals in the corresponding transistor under measurement; and
  a capacitor voltage output section that, on condition that a selection signal is input from outside, outputs a capacitor voltage at an end of the capacitor which is closer to the source and drain terminals, as the output signal, and the output measuring section includes measuring the capacitor voltage, as the electrical characteristic of the selected transistor under measurement.

35. A computer readable medium storing thereon a program for use with a management apparatus that manages a quality of a manufacturing line designed for manufacturing an electronic device through a plurality of manufacturing stages, when executed, the program causing the management apparatus to function as:
  a manufacturing control section that causes the manufacturing line to manufacture a wafer that has therein a test circuit including a plurality of transistors under measurement; and
  an identifying section that receives a measured electrical characteristic of each of the plurality of transistors under measurement, and identifies, among the plurality of manufacturing stages, a manufacturing stage in which a defect is generated, with reference to a distribution, on the wafer, of one or more transistors under measurement whose electrical characteristics do not meet a predetermined standard.

36. The computer readable medium as set forth in claim 35, wherein
the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the program causes the management apparatus to further function as a measuring section that measures an electrical characteristic of each of the plurality of transistors under measurement included in the test circuit; the measuring section including:
  a transistor selecting section of sequentially selecting each of the plurality of circuits under measurement by using the selecting section; and
  an output measuring section of measuring the electrical characteristic of the transistor under measurement included in the selected circuit under measurement, based on the output signal output onto the output signal line from the selected circuit under measurement, each of the plurality of circuits under measurement includes:
  a gate voltage control section that applies a designated gate voltage to a gate terminal of a corresponding one of the plurality of transistors under measurement;

a reference voltage input section that supplies a reference voltage input thereto from outside to a reference voltage terminal of the corresponding transistor under measurement, the reference voltage terminal being one of a drain terminal and a source terminal of the corresponding transistor under measurement; and a terminal voltage output section that, on condition that a selection signal is input from outside, outputs a terminal voltage at a terminal of the corresponding transistor under measurement as the output signal, the terminal being one of the drain and source terminals of the corresponding transistor under measurement and is not the reference voltage terminal, the selecting section includes:

a row selecting section that outputs a selection signal to one or more circuits under measurement which correspond to a designated row, from among the plurality of circuits under measurement that are arranged in the two-dimensional matrix; and a column selecting section that selects a circuit under measurement corresponding to a designated column, from among the one or more circuits under measurement to which the row selecting section has input the selection signal, and causes the output signal line to output a terminal voltage of the selected circuit under measurement, the test circuit further includes a plurality of current sources that are provided in a one-to-one correspondence with a plurality of columns formed by the plurality of circuits under measurement, each of the plurality of current sources supplying a designated source-drain current to a corresponding one of the one or more circuits under measurement to which the row selecting section has input the selection signal, and the output measuring section includes measuring the terminal voltage, as the electrical characteristic of the selected transistor under measurement.

37. The computer readable medium as set forth in claim 36, wherein the measuring section measures, as the electrical characteristic of each of the plurality of transistors under measurement, a threshold voltage of the transistor under measurement, based on the reference voltage and the terminal voltage of the transistor under measurement.

38. The computer readable medium as set forth in claim 35, wherein the manufacturing control section causes the manufacturing line to manufacture the wafer that has therein the test circuit including (i) a plurality of circuits under measurement that are arranged in a two-dimensional matrix and contain the plurality of transistors under measurement in a one-to-one correspondence and (ii) a selecting section that causes an output signal line to output an output signal of a designated one of the plurality of circuits under measurement, the output signal line being provided in common to the plurality of circuits under measurement, the program causes the management apparatus to further function as a measuring section that measures an electrical characteristic of each of the plurality of transistors under measurement included in the test circuit; the measuring section including:

a transistor selecting section of sequentially selecting each of the plurality of circuits under measurement by using the selecting section; and an output measuring section of measuring the electrical characteristic of the transistor under measurement included in the selected circuit under measurement, based on the output signal output onto the output signal line from the selected circuit under measurement, each of the plurality of circuits under measurement includes:

a gate voltage control section that applies a designated gate voltage to a gate terminal of a corresponding one of the plurality of transistors under measurement;

a voltage applying section that applies a voltage to a source terminal and a drain terminal of the corresponding transistor under measurement, and controls a voltage applied to a gate insulation film of the corresponding transistor under measurement so as to remain at a substantially constant level;

a capacitor that accumulates a gate leakage current flowing from the gate terminal to the source and drain terminals in the corresponding transistor under measurement; and a capacitor voltage output section that, on condition that a selection signal is input from outside, outputs a capacitor voltage at an end of the capacitor which is closer to the source and drain terminals, as the output signal, and the output measuring section includes measuring the capacitor voltage, as the electrical characteristic of the selected transistor under measurement.

* * * * *

UNITED STATES PATENT AND TRADEMARK OFFICE
CERTIFICATE OF CORRECTION

| | |
|---|---|
| PATENT NO. | : 7,774,081 B2 |
| APPLICATION NO. | : 12/046457 |
| DATED | : August 10, 2010 |
| INVENTOR(S) | : Toshiyuki Okayasu et al. |

It is certified that error appears in the above-identified patent and that said Letters Patent is hereby corrected as shown below:

On the cover page of the Letters Patent, please replace item (73) Assignee's Name with:

ADVANTEST CORPORATION, Tokyo (JP)

NATIONAL UNIVERSITY CORPORATION TOHOKU UNIVERSITY, Miyagi (JP)

Signed and Sealed this
Fifth Day of July, 2011

David J. Kappos
*Director of the United States Patent and Trademark Office*